United States Patent
Iwasaki et al.

(10) Patent No.: US 12,476,616 B2
(45) Date of Patent: Nov. 18, 2025

(54) FILTER AND MULTIPLEXER

(71) Applicant: TAIYO YUDEN CO., LTD., Tokyo (JP)

(72) Inventors: Sho Iwasaki, Tokyo (JP); Jyunichi Hamasaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 387 days.

(21) Appl. No.: 17/845,539

(22) Filed: Jun. 21, 2022

(65) Prior Publication Data

US 2023/0006649 A1    Jan. 5, 2023

(30) Foreign Application Priority Data

Jul. 2, 2021 (JP) ................. 2021-110678

(51) Int. Cl.
*H03H 9/64* (2006.01)
*H03H 9/145* (2006.01)
(Continued)

(52) U.S. Cl.
CPC .......... *H03H 9/6483* (2013.01); *H03H 9/145* (2013.01); *H03H 9/25* (2013.01); *H03H 9/725* (2013.01)

(58) Field of Classification Search
CPC ............ H03H 9/145; H03H 9/25; H03H 9/64; H03H 9/72
See application file for complete search history.

(56) References Cited

U.S. PATENT DOCUMENTS 5,592,135 A * 1/1997 Taguchi ............... H03H 9/6483
                                                    333/195
6,819,203 B2 * 11/2004 Taniguchi ............ H03H 9/6433
                                                    333/195
(Continued)

FOREIGN PATENT DOCUMENTS

| JP | 2008-532334 A | 8/2008 |
| JP | 2015-073331 A | 4/2015 |
| JP | 2017-034363 A | 2/2017 |

OTHER PUBLICATIONS

Notice of Reasons for Refusal mailed Apr. 1, 2025, issued to Japanese Patent Application No. 2021-110678.

*Primary Examiner* — Andrea Lindgren Baltzell
*Assistant Examiner* — Alan Wong
(74) *Attorney, Agent, or Firm* — Stein IP, LLC

(57) ABSTRACT

A filter includes a support substrate, a piezoelectric layer, one or more series resonators connected in series between input and output terminals, each having first electrode fingers having a first average pitch, one or more parallel resonators having one end connected to a path and another end connected to a ground, each having second electrode fingers having a second average pitch more than a maximum first average pitch, another resonator having one end connected to the path, and having third electrode fingers having a third average pitch less than or equal to an intermediate value between the maximum first average pitch and a minimum second average pitch, and an inductor having one end connected to the another resonator and another end connected to the ground, and having an inductance more than a maximum inductance of another inductor connected between the parallel resonators and the ground.

11 Claims, 25 Drawing Sheets

(51) Int. Cl.
*H03H 9/25* (2006.01)
*H03H 9/72* (2006.01)

(56) References Cited

U.S. PATENT DOCUMENTS

| | | | |
|---|---|---|---|
| 8,847,700 B2 * | 9/2014 | Hara | H03H 9/706 |
| | | | 333/195 |
| 10,250,230 B2 * | 4/2019 | Ono | H03H 9/64 |
| 10,715,111 B2 * | 7/2020 | Ozasa | H03H 9/14541 |
| 10,742,194 B2 * | 8/2020 | Takamine | H03H 9/542 |
| 10,979,027 B2 * | 4/2021 | Nosaka | H03F 3/19 |
| 11,115,000 B2 * | 9/2021 | Nakahashi | H03H 9/6409 |
| 11,239,826 B2 * | 2/2022 | Kondo | H03H 9/70 |
| 11,405,018 B2 * | 8/2022 | Takata | H04B 1/0057 |
| 11,528,009 B2 * | 12/2022 | Urata | H03H 9/0557 |
| 2008/0116993 A1 * | 5/2008 | Yamakawa | H03H 9/605 |
| | | | 333/32 |
| 2013/0285768 A1 | 10/2013 | Watanabe et al. | 333/193 |
| 2017/0033765 A1 | 2/2017 | Moriya et al. | H03H 9/02834 |
| 2020/0313650 A1 * | 10/2020 | Yamamoto | H03H 9/725 |

* cited by examiner

FILTER AND MULTIPLEXER

CROSS-REFERENCE TO RELATED APPLICATION

This application is based upon and claims the benefit of priority of the prior Japanese Patent Application No. 2021-110678, filed on Jul. 2, 2021, the entire contents of which are incorporated herein by reference.

FIELD

A certain aspect of the present invention relates to a filter and a multiplexer, for example, a filter and a multiplexer having a pair of interdigital electrodes.

BACKGROUND

There has been known an acoustic wave resonator having a pair of interdigital electrodes on a piezoelectric layer as an acoustic wave resonator used in a communication device such as a smartphone. It has been known to bond the piezoelectric layer to a support substrate (for example, see Japanese Patent Application Publications No. 2017-34363 and No. 2015-73331).

SUMMARY OF THE INVENTION

Bonding the piezoelectric layer to the support substrate can reduce a temperature-frequency coefficient. However, a spurious response occurs at frequencies higher than the response due to an acoustic wave in a main mode. Here, the "spurious" means unwanted waves.

The present disclosure has been made in view of the above problem, and an object of the present disclosure is to suppress the spurious.

According to an aspect of the present invention, there is provided a filter including: a support substrate; a piezoelectric layer provided on the support substrate; one or more series resonators connected in series between an input terminal and an output terminal, wherein each of the one or more series resonators has a plurality of first electrode fingers provided on the piezoelectric layer and having a first average pitch; one or more parallel resonators having one end connected to a path between the input terminal and the output terminal and another end connected to a ground, wherein each of the one or more parallel resonators has a plurality of second electrode fingers provided on the piezoelectric layer and having a second average pitch more than a maximum first average pitch; another resonator having one end connected to the path, wherein the another resonator has a plurality of third electrode fingers provided on the piezoelectric layer and having a third average pitch less than or equal to an intermediate value between the maximum first average pitch and a minimum second average pitch; and an inductor having one end connected to another end of the another resonator and another end connected to the ground, and having an inductance more than a maximum inductance connected between the one or more parallel resonators and the ground.

DETAILED DESCRIPTION (Acoustic Wave Resonator)

Figure 1A:
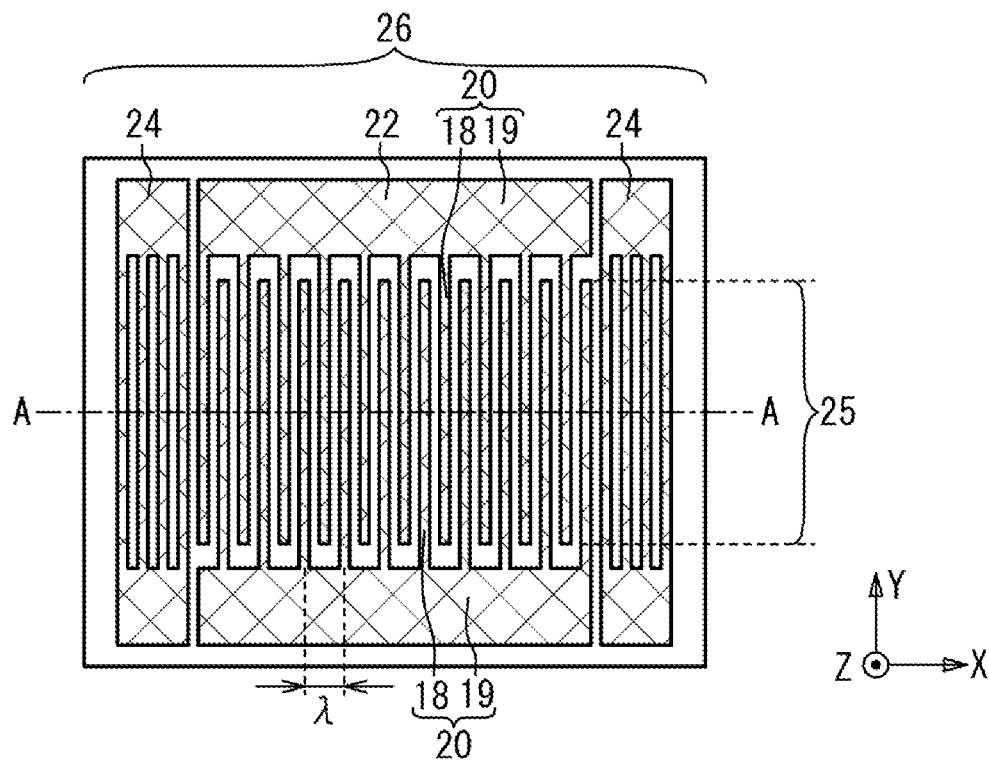
FIG. 1A is a plan view illustrating an acoustic wave resonator R1 used in a filter of an embodiment and a comparative example.
Figure 1B:
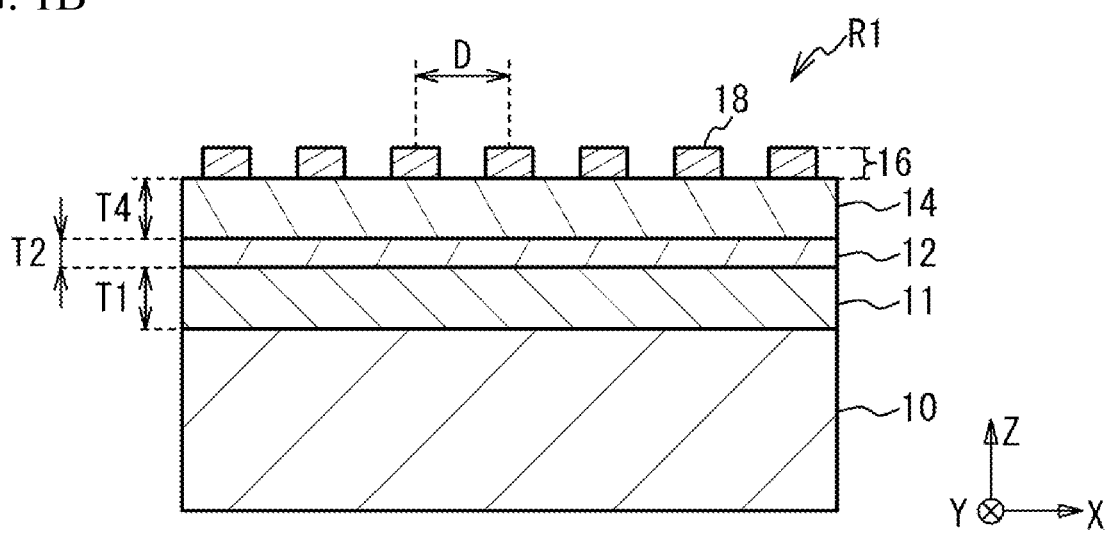
FIG. 1B is a cross-sectional view taken along line A-A of FIG. 1A.

An acoustic wave resonator used in an embodiment and a comparative example will be described. FIG. 1A is a plan view illustrating an acoustic wave resonator R1 used in a filter of the embodiment and the comparative example, and FIG. 1B is a cross-sectional view taken along line A-A of FIG. 1A. An arrangement direction of the electrode fingers is an X direction, an extension direction of the electrode fingers is a Y direction, and a stacking direction of a support substrate and a piezoelectric layer is a Z direction. The X, Y, and Z directions do not necessarily correspond to the X and Y axis directions of a crystal orientation of the piezoelectric layer. If the piezoelectric layer is a rotary Y-cut X propagation substrate, the X direction is the X axis direction of the crystallographic orientation.

As illustrated in FIGS. 1A and 1B, the piezoelectric layer 14 is provided on a support substrate 10. A temperature compensation film 12 is provided between the support substrate 10 and the piezoelectric layer 14. A boundary layer 11 is provided between the support substrate 10 and the temperature compensation film 12. An acoustic wave resonator 26 is provided on the piezoelectric layer 14. The acoustic wave resonator 26 has an IDT 22 and reflectors 24. The reflectors 24 are provided on both sides of the IDT 22 in the X direction. The IDT 22 and the reflectors 24 are formed by a metal film 16 on the piezoelectric layer 14.

The IDT 22 includes a pair of opposed interdigital electrodes 20. The interdigital electrode 20 includes a plurality of electrode fingers 18 and a bus bar 19 to which the plurality of electrode fingers 18 are connected. A region where the electrode fingers 18 of the pair of interdigital electrodes 20 intersect when viewed from the X direction is an intersection region 25. The length of the intersection region 25 is an aperture length. In the pair of interdigital electrodes 20, the electrode fingers 18 are alternately provided in at least a part of the intersection region 25. The acoustic waves mainly excited by the plurality of electrode fingers 18 in the intersection region 25 propagate mainly in the X direction. A pitch between the electrode fingers 18 in one of the pair of interdigital electrodes 20 is substantially a wavelength $\lambda$ of the acoustic wave. If a pitch between the plurality of electrode fingers 18 (the pitch between the centers of the electrode fingers 18) is D, the pitch between the electrode fingers 18 of one interdigital electrode 20 is twice the pitch D between the electrode fingers 18. The reflector 24 reflects the acoustic waves (surface acoustic waves) excited by the electrode fingers 18 of the IDT 22. This confines the acoustic waves within the intersection region 25 of the IDT 22.

The piezoelectric layer 14 is a single-crystal lithium tantalate ($LiTaO_3$) layer or a single-crystal lithium niobate ($LiNbO_3$) layer, for example, a rotary Y-cut X propagation lithium tantalate layer or a rotary Y-cut X propagation lithium niobate layer. For the Y-cut X propagation lithium tantalate layer with a rotation of 36° or more and 48° or less, the SH (Shear Horizontal) wave becomes the acoustic wave in the main mode. A thickness T4 of the piezoelectric layer 14 is equal to or less than the wavelength $\lambda$ of the acoustic wave (that is, twice the pitch D).

The support substrate 10 is, for example, a sapphire substrate, an alumina substrate, a silicon substrate, a spinel substrate, a crystal substrate, a quartz substrate, or a silicon carbide substrate. The sapphire substrate is a single crystal $Al_2O_3$ substrate, and the alumina substrate is a polycrystalline or amorphous $Al_2O_3$ substrate. The silicon substrate is a single crystal or polycrystalline silicon substrate, the spinel substrate is a polycrystalline or amorphous $MgAl_2O_4$ substrate, and the crystal substrate is a single crystal $SiO_2$ substrate. The quartz substrate is a polycrystalline or amorphous $SiO_2$ substrate, and the silicon carbide substrate is a polycrystalline or single crystal SiC substrate. A linear expansion coefficient in the X direction of the support substrate 10 is smaller than the linear expansion coefficient in the X direction of the piezoelectric layer 14. This makes it possible to reduce a frequency-temperature dependence of the acoustic wave resonator.

The temperature compensation film 12 has a temperature coefficient of an elastic constant having a symbol opposite to that of the temperature coefficient of the elastic constant of the piezoelectric layer 14. For example, the temperature coefficient of the elastic constant of the piezoelectric layer 14 is negative, and the temperature coefficient of the elastic constant of the temperature compensation film 12 is positive. The temperature compensation film 12 is an insulating film containing silicon oxide ($SiO_2$) as a main component, and is, for example, a silicon oxide ($SiO_2$) film containing no additive or an additive element such as fluorine, and is, for example, polycrystalline or amorphous. This makes it possible to reduce the temperature coefficient of frequency of the acoustic wave resonator. When the temperature compensation film 12 is a silicon oxide film, an acoustic velocity of the bulk wave propagating through the temperature compensation film 12 is slower than the acoustic velocity of the bulk wave propagating through the piezoelectric layer 14.

In order for the temperature compensation film 12 to have a temperature compensation function, it is required that the energy of the acoustic wave in the main mode exists in the temperature compensation film 12 to some extent. Although the range in which the energy of the surface acoustic wave is concentrated depends on the type of surface acoustic wave, the energy of the surface acoustic wave is typically concentrated in the range of $2\lambda$ ($\lambda$ is the wavelength of the acoustic wave) from an upper surface of the piezoelectric layer 14, and particularly in the range of $\lambda$ from the upper surface of the piezoelectric layer 14. Therefore, a distance (thickness T2+T4) from a lower surface of the temperature compensation film 12 to the upper surface of the piezoelectric layer 14 is preferably $2\lambda$ or less, more preferably $1\lambda$ or less, and further preferably $0.6\lambda$ or less.

The acoustic velocity of the bulk wave in the boundary layer 11 is faster than the acoustic velocity of the bulk wave in the temperature compensation film 12. The boundary layer 11 is a polycrystalline film or an amorphous film such as aluminum oxide, aluminum nitride, silicon, silicon nitride or silicon carbide. By providing the boundary layer 11, the acoustic wave in the main mode can be confined in the piezoelectric layer 14 and the temperature compensation film 12, and an unwanted wave such as a bulk wave can be attenuated in the boundary layer 11. Therefore, the spurious due to the unwanted wave can be suppressed. A thickness T1 of the boundary layer 11 is, for example, $1\lambda$ to $5\lambda$.

The metal film 16 is, for example, a film containing aluminum (Al), copper (Cu) or molybdenum (Mo) as a main component. An adhesive film such as a titanium (Ti) film or a chromium (Cr) film may be provided between the electrode finger 18 and the piezoelectric layer 14. The adhesive film is thinner than the electrode finger 18. An insulating film thinner than the electrode finger 18 may be provided so as to cover the electrode finger 18. The insulating film functions as a protective film.

(High Frequency Spurious)

Figure 2A:
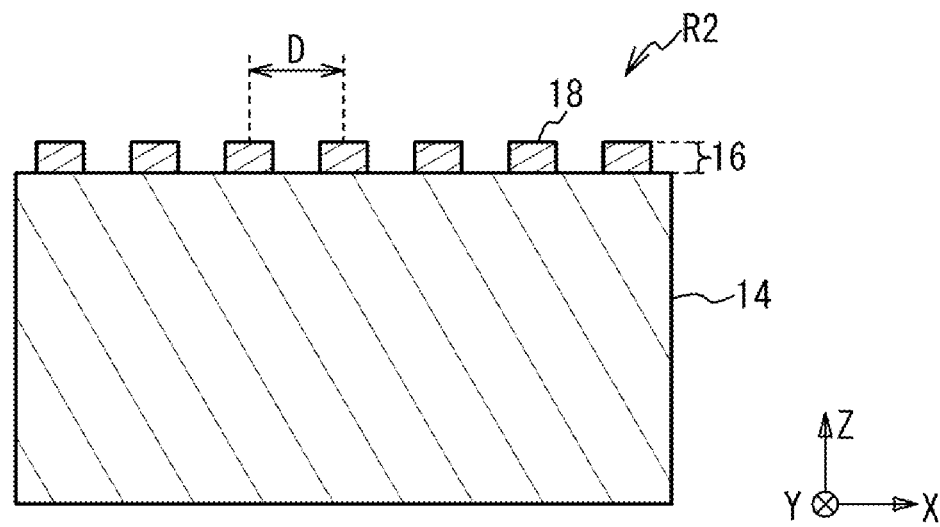
FIGS. 2A and 2B are cross-sectional views illustrating acoustic wave resonators R2 and R3.
Figure 2B:
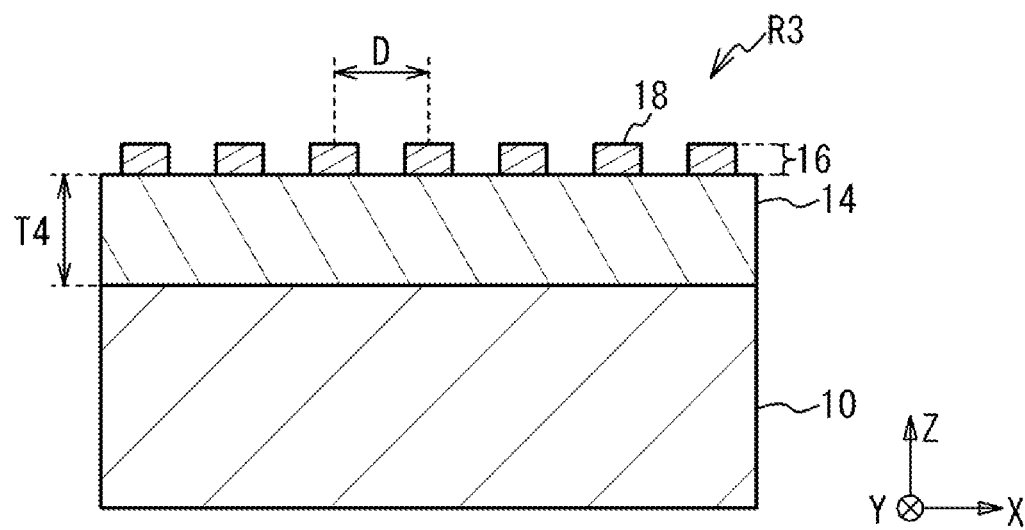

High frequency spurious will be described. FIGS. 2A and 2B are cross-sectional views illustrating acoustic wave resonators R2 and R3. The plan views of the acoustic wave resonators R2 and R3 are the same as that of the acoustic wave resonator R1 of FIG. 1A.

As illustrated in FIG. 2A, in the acoustic wave resonator R2, the piezoelectric layer 14 is a piezoelectric substrate, and the support substrate is not provided. A thickness of the piezoelectric layer 14 is 100 µm or more. As illustrated in FIG. 2B, in the acoustic wave resonator R3, the piezoelectric layer 14 is provided on the support substrate 10. A thickness T4 of the piezoelectric layer 14 is 10 times or more than the wavelength λ of the acoustic wave.

Figure 3A:
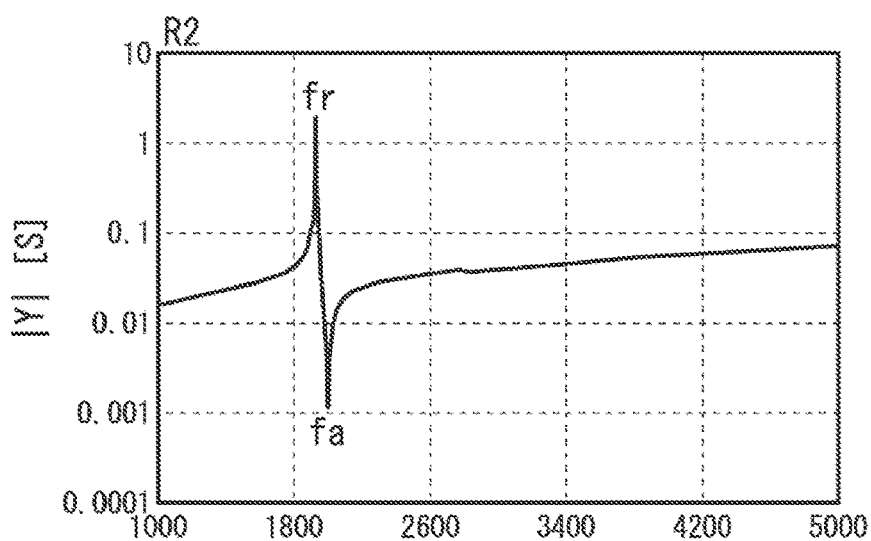
FIG. 3A to 3C are schematic diagrams illustrating |Y| with respect to a frequency in the acoustic wave resonators R2, R3, and R1, respectively.
Figure 3B:
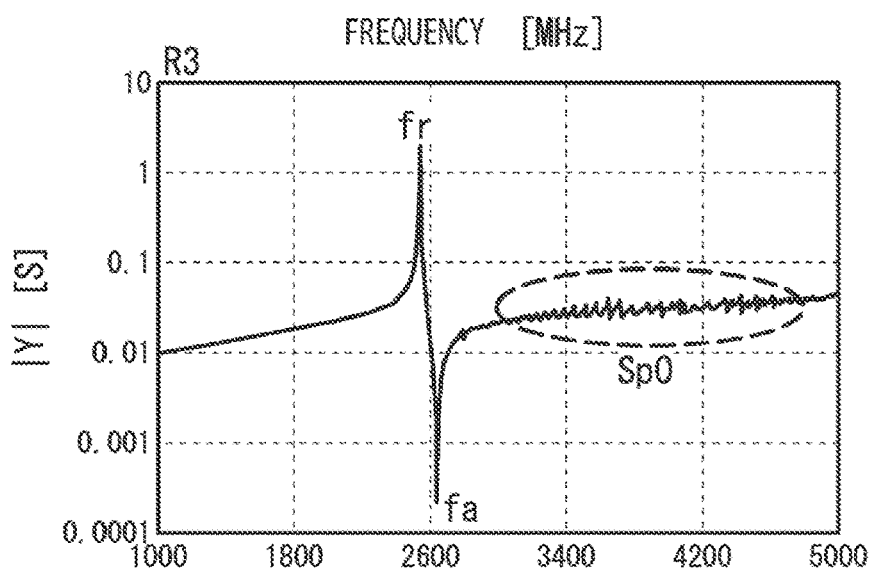
Figure 3C:
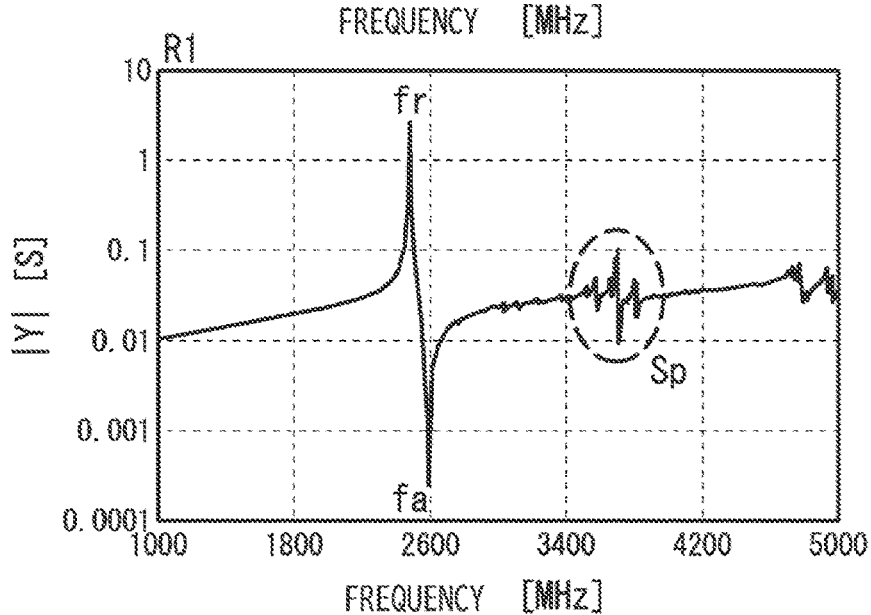

The spurious of the acoustic wave resonators R1 to R3 will be described. FIG. 3A to 3C are schematic diagrams illustrating |Y| with respect to a frequency in the acoustic wave resonators R2, R3, and R1, respectively. It is assumed that a 42° rotary Y-cut X-propagation lithium tantalate layer is used as the piezoelectric layer 14. The |Y| is an absolute value of admittance.

As illustrated in FIG. 3A, the |Y| is maximum at a resonance frequency fr and the |Y| is minimum at an antiresonance frequency fa as a main response by the acoustic wave in the main mode. In the acoustic wave resonator R2 that does not use the support substrate 10, the spurious response is hardly observed at frequencies higher than the antiresonance frequency fa. In the acoustic wave resonator R2, since the linear expansion coefficient of the piezoelectric layer 14 is large, the temperature coefficient of frequency at the resonance frequency or the like is large. In the acoustic wave resonator R3, since the piezoelectric layer 14 is bonded on the support substrate 10 having a linear expansion coefficient smaller than that of the piezoelectric layer 14, the temperature coefficient of frequency is small.

As illustrated in FIG. 3B, in the acoustic wave resonator R3 in which the piezoelectric layer 14 is bonded on the support substrate 10, a spurious response Sp0 is observed at a frequency higher than the antiresonance frequency fa. The spurious response Sp0 is observed over a wide frequency range. The spurious response Sp0 is generated because the unwanted waves such as bulk waves are confined in the piezoelectric layer 14 together with the acoustic waves in the main mode.

As illustrated in FIG. 3C, in the acoustic wave resonator R1 in which the thickness T4 of the piezoelectric layer 14 is equal to or less than the wavelength λ of the acoustic wave, a difference between the resonance frequency fr and the antiresonance frequency fa is larger than that of the acoustic wave resonator R3. This indicates that the acoustic wave resonator R1 has a larger electromechanical coupling coefficient than the acoustic wave resonator R3. Further, the resonance frequency fr and the antiresonance frequency fa are steeper than those of the acoustic wave resonator R3. This indicates that the acoustic wave resonator R1 has a higher Q value than the acoustic wave resonator R3. The spurious response Sp is observed at frequencies in the frequency range narrower than that of the acoustic wave resonator R3. The magnitude of the spurious response Sp is larger than the spurious response Sp0 of the acoustic wave resonator R3.

As described above, when the piezoelectric layer 14 is bonded onto the support substrate 10, the temperature coefficient of frequency is small, but the spurious responses Sp0 and Sp occur at frequencies higher than the antiresonance frequency fa. When the thickness T4 of the piezoelectric layer 14 is set to the wavelength λ or less of the acoustic wave as in the acoustic wave resonator R1, the Q value and the electromechanical coupling coefficient become large. The large spurious response Sp is generated in a high frequency range in the frequency range of the spurious response Sp0 of the acoustic wave resonator R3. Such a spurious response is called a high frequency spurious.

Figure 4:
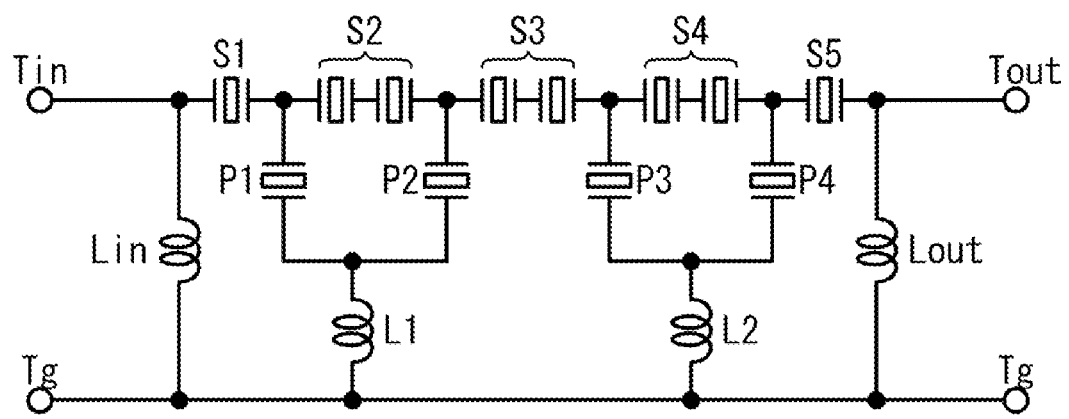
FIG. 4 is a circuit diagram illustrating a ladder type filter F.

The passage characteristics of a ladder type filter using the acoustic wave resonator R1 will be described. FIG. 4 is a circuit diagram illustrating a ladder type filter F. As illustrated in FIG. 4, the ladder type filter F is an 8-stage ladder type filter including series resonators S1 to S5 and parallel resonators P1 to P4. The series resonators S1 to S5 are connected in series between the input terminal Tin and the output terminal Tout. Each of the series resonators S2 to S4 is divided in series into two resonators. The parallel resonators P1 to P4 are connected in parallel between the input terminal Tin and the output terminal Tout. One ends of the parallel resonators P1 to P4 are connected to a path between the input terminal Tin and the output terminal Tout, and the other ends are connected to the ground terminal Tg. The parallel resonators P1 and P2 are connected to the ground terminal Tg via an inductor L1, and the parallel resonators P3 and P4 are connected to the ground terminal Tg via an inductor L2. The inductors L1 and L2 correspond to the parasitic inductances and are 0.1 nH or less. An inductor Lin is connected between the input terminal Tin and the ground terminal Tg, and an inductor Lout is connected between the output terminal Tout and the ground terminal Tg. The inductors Lin and Lout are matching inductors and may not be connected.

Figure 5A:
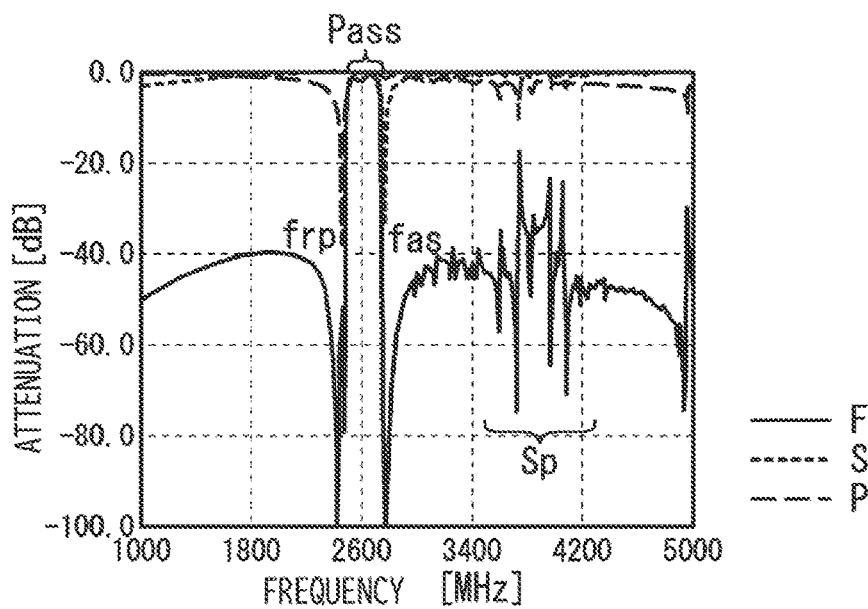
FIG. 5A to 5C are schematic views illustrating the passage characteristics of the ladder type filter F, a series resonator S, and a parallel resonator P.
Figure 5B:
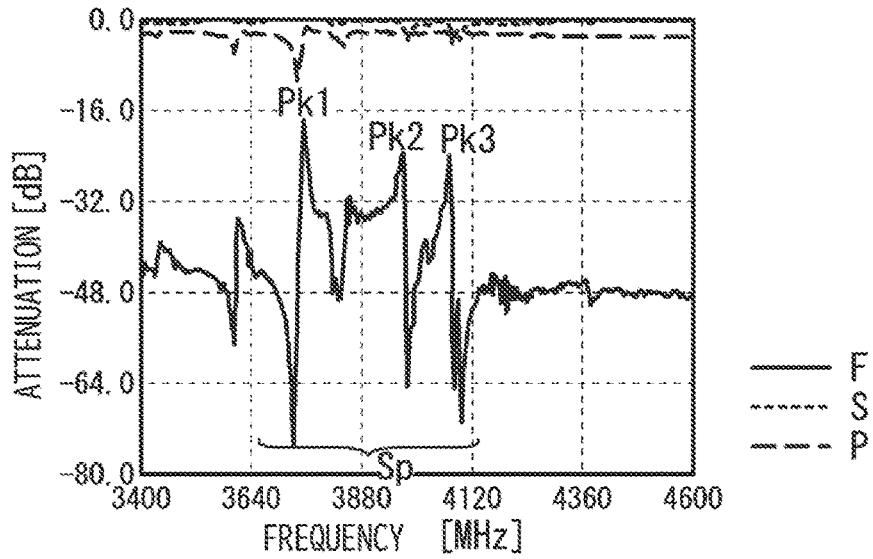
Figure 5C:
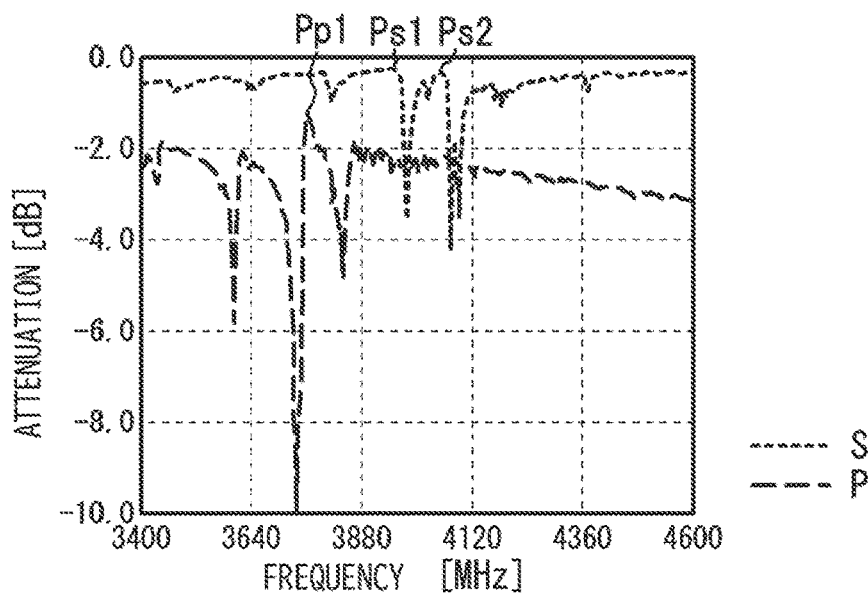

FIG. 5A to 5C are schematic views illustrating the passage characteristics of the ladder type filter F, a series resonator S, and a parallel resonator P. FIG. 5B is an enlarged view illustrating the vicinity of the spurious response of FIG. 5A. FIG. 5C is an enlarged view illustrating the passage characteristics of the series resonator S and the parallel resonator P of FIG. 5B. F indicates the passage characteristic of the ladder type filter F, S indicates the passage characteristics of the series resonators S1 to S5, and P indicates the passage characteristics of the shunt-connected parallel resonators P1 to P4. The passage characteristics of the series resonators S1 to S5 are all the same as each other, and the passage characteristics of the parallel resonators P1 to P4 are all the same as each other.

As illustrated in FIG. 5A, a pass band Pass of the ladder type filter F is formed in the vicinity of 2600 MHz. An attenuation region on a low frequency side of the pass band Pass is formed by a resonance frequency frp of the parallel resonator P, and an attenuation region on a high frequency side of the pass band Pass is formed by an antiresonance frequency fas of the series resonator S. The spurious response Sp due to the high frequency spurious response occurs in the vicinity of 3500 MHz to 4200 MHz. Comparing FIGS. 5B and 5C, the spurious response Sp of the filter F is formed at frequencies corresponding to the spurious response of the series resonator S and the parallel resonator P. For example, peaks Pk1 to Pk3 of the spurious response of the filter F in FIG. 5B correspond to a peak Pp1 of the spurious response of the parallel resonator P and peaks Ps1 and Ps2 of the spurious response of the series resonator S in FIG. 5C. In this way, in the ladder type filter F, since the series resonators S1 to S5 and the parallel resonators P1 to P4 are connected in multiple stages, the spurious response of the single series resonator S overlaps with the spurious response of another single series resonator S and the spurious response of the single parallel resonator P overlaps with the spurious response of another single parallel resonator P, resulting in a large spurious response. When the peaks of the spurious response are formed in the attenuation region, an attenuation amount becomes small, which causes a problem.
(Simulation 1)

Figure 6:
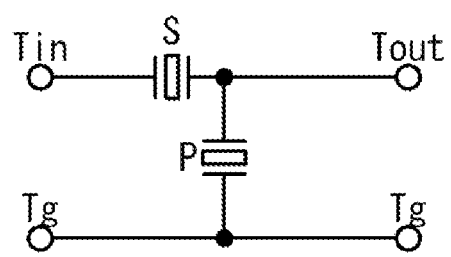
FIG. 6 is a circuit diagram illustrating the ladder type filter used in a simulation 1.

A simulation was performed to suppress the spurious response in a one-stage ladder type filter. FIG. 6 is a circuit diagram illustrating the ladder type filter used in a simulation 1. As illustrated in FIG. 6, between the input terminal Tin and the output terminal Tout, a series resonator S is connected in series and a parallel resonator P is connected in parallel.

Figure 7A:
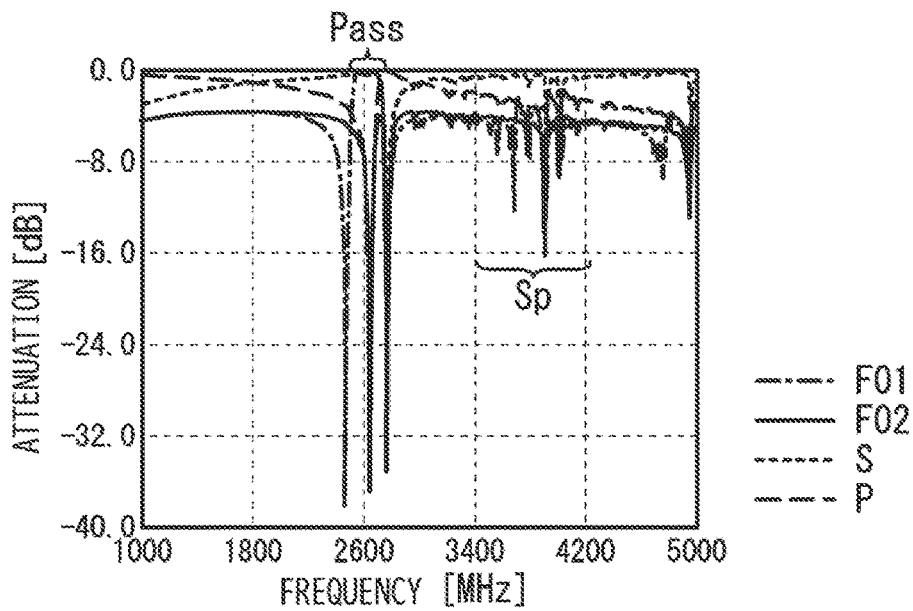
FIG. 7A to 7C are diagrams illustrating the passage characteristics of filters F01 and F02 in the simulation 1.
Figure 7B:
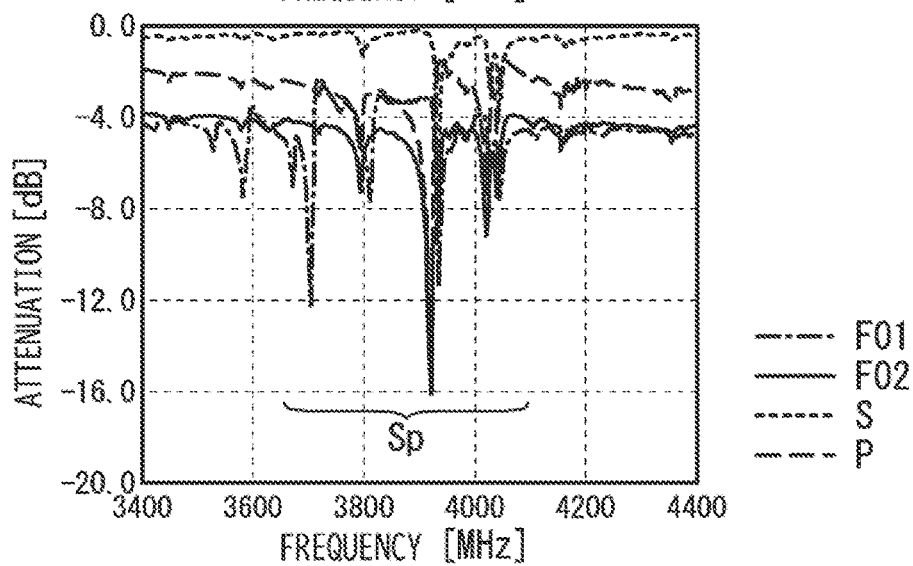
Figure 7C:
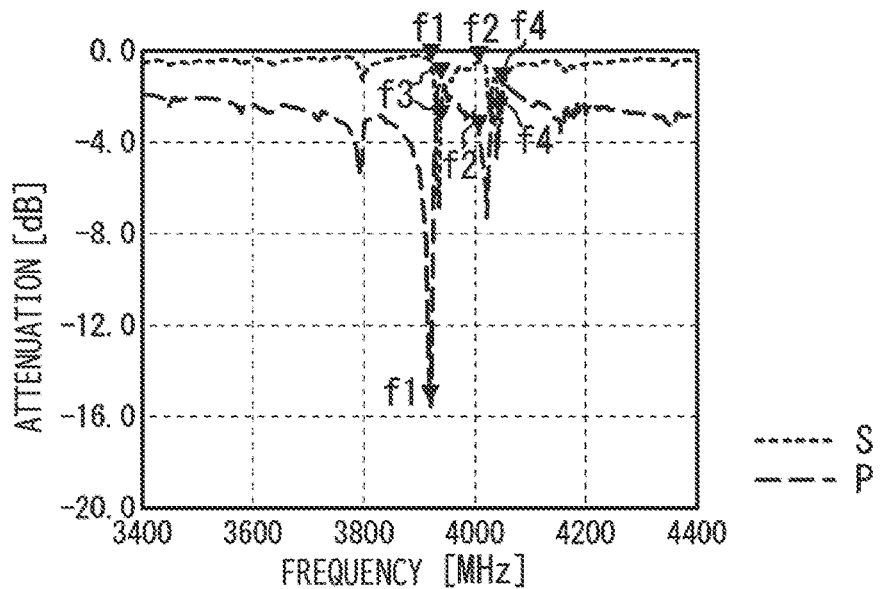

The simulation conditions are as follows.
Support substrate 10: Sapphire substrate having a thickness of 30 μm
Boundary layer 11: Aluminum oxide layer having a thickness of 6 μm
Temperature compensation film 12: Silicon oxide film having a thickness of 0.4 μm
Piezoelectric layer 14: 42° Y-cut X propagation lithium tantalate layer having a thickness of 0.5 μm
Metal film 16: Titanium film having a thickness of 40 nm and an aluminum film having a thickness of 117 nm arranged in this order from the piezoelectric layer 14
An interface between the support substrate 10 and the boundary layer 11 is a mirror surface Filter 01
2×pitch Dp of series resonator S: 1.39 μm
2×pitch Ds of parallel resonator P: 1.50 μm Filter 02
2×pitch Dp of series resonator S: 1.39 μm
2×pitch Ds of parallel resonator P: 1.39 μm FIG. 7A to 7C are diagrams illustrating the passage characteristics of the filters F01 and F02 in the simulation 1. "S" and "P" are the passage characteristics of the series resonator S and the parallel resonator P in the filter F02, respectively. FIG. 7B is an enlarged view illustrating the vicinity of the spurious response of FIG. 7A. FIG. 7C is an enlarged view illustrating the passage characteristics of the series resonator S and the parallel resonator P of FIG. 7B.

As illustrated in FIG. 7A, in the filter F01, a pitch Dp of the parallel resonator P is made larger than a pitch Ds of the series resonator S. Thereby, the pass band Pass is formed between the resonance frequency frp of the parallel resonator P and the antiresonance frequency fas of the parallel resonator P. In the filter F02, since the pitch Dp of the parallel resonator P is the same as the pitch Ds of the series resonator S, the pass band is not formed.

As illustrated in FIG. 7B, the filter F02 has a larger attenuation amount at the peaks of the spurious response Sp than the filter F01. As illustrated in FIG. 7C, at the peak frequencies f1 and f2 of the series resonator S, the attenuation amount of the parallel resonator P becomes large. At the peak frequencies f3 and f4 of the parallel resonator P, the attenuation amount of the series resonator S becomes large. In this way, when the pitch Ds of the series resonator S and the pitch Dp of the parallel resonator P are the same as each other, the series resonator S and the parallel resonator P cancel the peaks of the spurious response with a notch. Thereby, the attenuation amount of the peaks of the spurious response Sp in filter F02 is larger than that in filter F01, as shown in FIG. 7B.
(Simulation 2)

Figure 8:
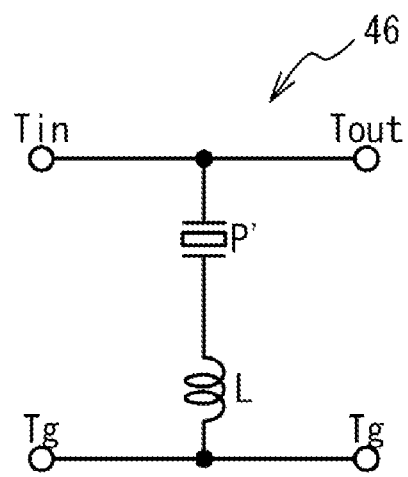
FIG. 8 is a circuit diagram illustrating a circuit 46 used in a simulation 2.

A simulation was performed on the passage characteristics of a circuit that suppresses the spurious response. FIG. 8 is a circuit diagram illustrating the circuit used in a simulation 2. As illustrated in FIG. 8, in the circuit 46, one end of the resonator P' is connected to the path between the input terminal Tin and the output terminal Tout, and the other end is connected to the ground terminal Tg via the inductor L.

First, the 2×pitch Dp' of the resonator P' was made constant at 1.39 μm, the inductance of the inductor L was changed, and the passage characteristics of the circuit 46 were simulated. Other simulation conditions are the same as those in the simulation 1.

Figure 9A:
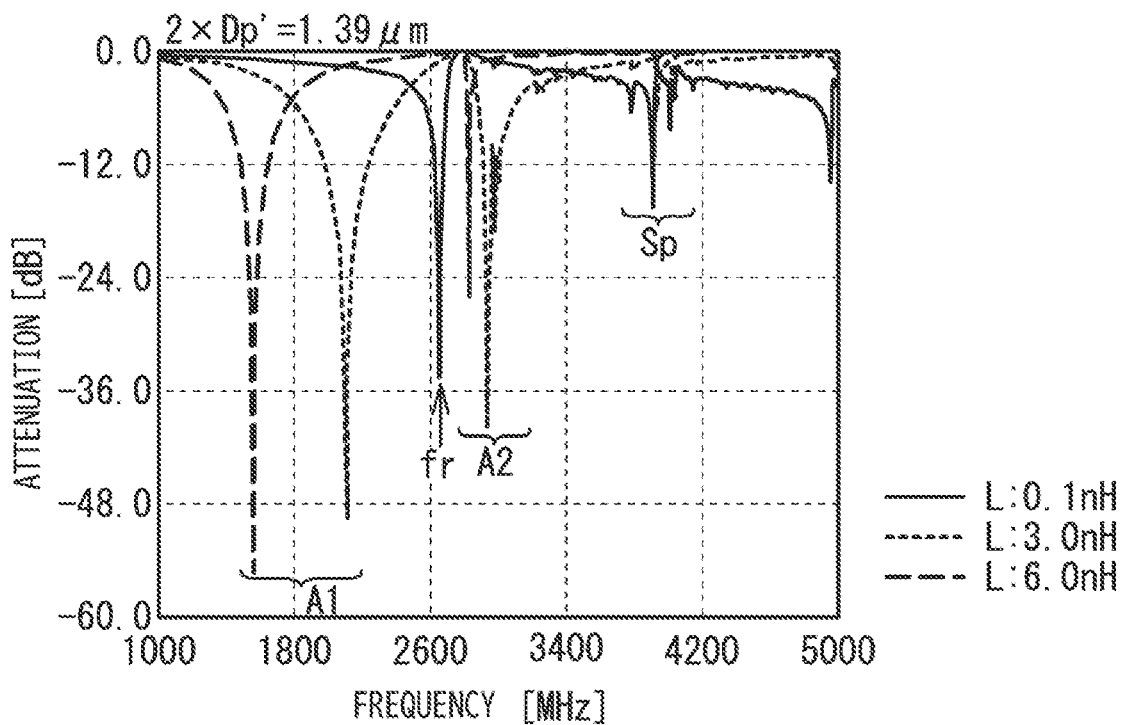
FIGS. 9A and 9B are diagrams illustrating the passage characteristics of the circuit 46 in the simulation 2.
Figure 9B:
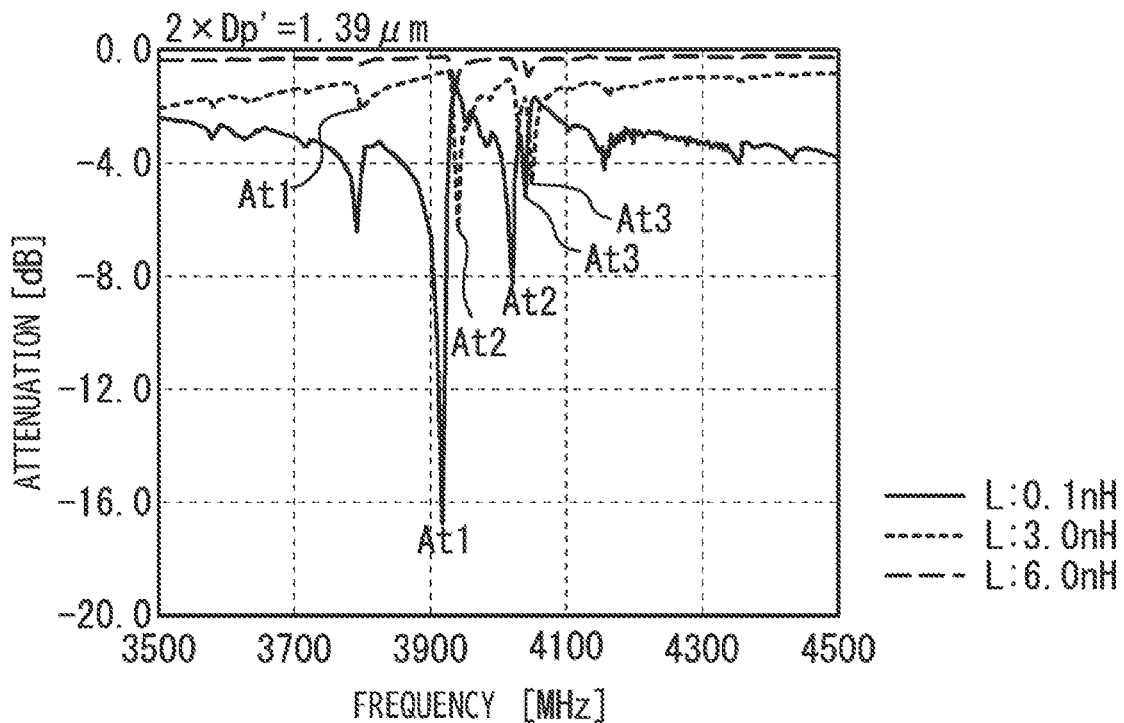

FIGS. 9A and 9B are diagrams illustrating the passage characteristics of the circuit 46 in the simulation 2. FIG. 9B is an enlarged view illustrating the vicinity of the spurious response of FIG. 9A. The inductances of the inductor L are 0.1 nH, 3.0 nH and 6.0 nH.

As illustrated in FIG. 9A, the inductor L having an inductance of 0.1 nH corresponds to a parasitic inductance. When the inductance of the inductor L is 0.1 nH, one attenuation pole corresponding to the resonance frequency fr of the resonator P' is formed. When the inductance of the inductor L is 3.0 nH, the attenuation pole is separated into two, one attenuation pole A1 is lower than the resonance frequency fr, and the other attenuation pole A2 is higher than the resonance frequency fr. When the inductance of the inductor L is 6.0 nH, the attenuation pole A1 is lower than the attenuation pole A1 at the inductance of 3.0 nH. The attenuation pole A2 at the inductance of 6.0 nH is lower than the attenuation pole A2 at the inductance of 3.0 nH and higher than the resonance frequency fr.

As illustrated in FIG. 9B, three poles of the spurious response Sp are designated as At1 to At3. When the inductance of the inductor L becomes large, the attenuation amounts of the poles At1 to At3 becomes small and the poles At1 to At3 shift to lower frequencies. The shift amounts of the poles At1 to At3 are smaller than the shift amounts of the attenuation poles A1 and A2.

Figure 10A:
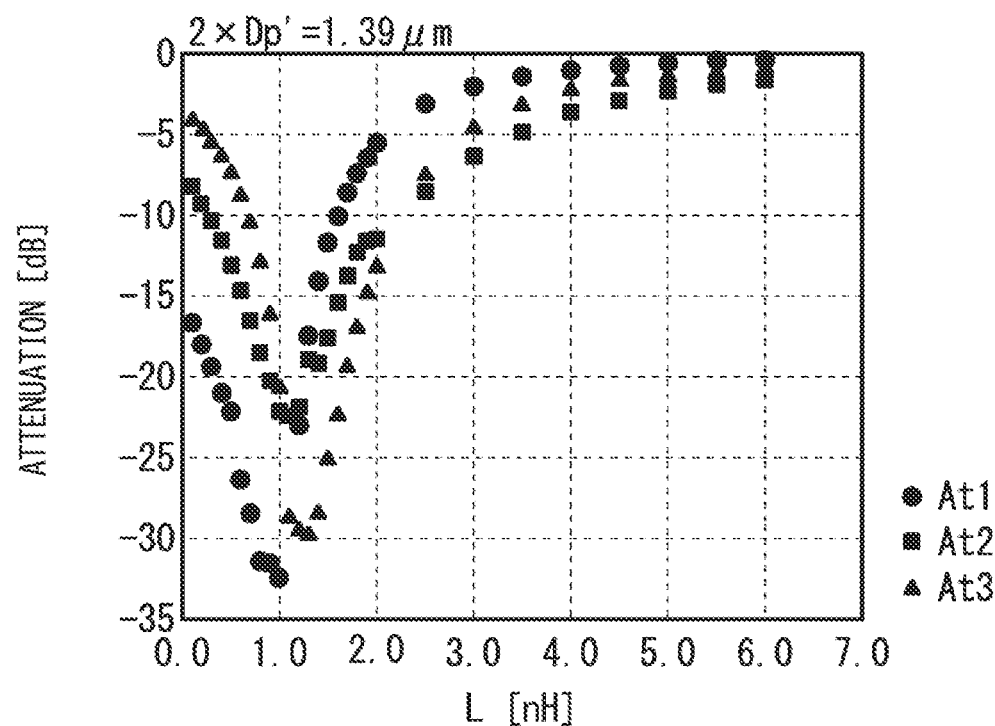
FIGS. 10A and 10B are diagrams illustrating the attenuation amounts and frequencies of poles At1 to At3 with respect to an inductance of an inductor L in the simulation 2.
Figure 10B:
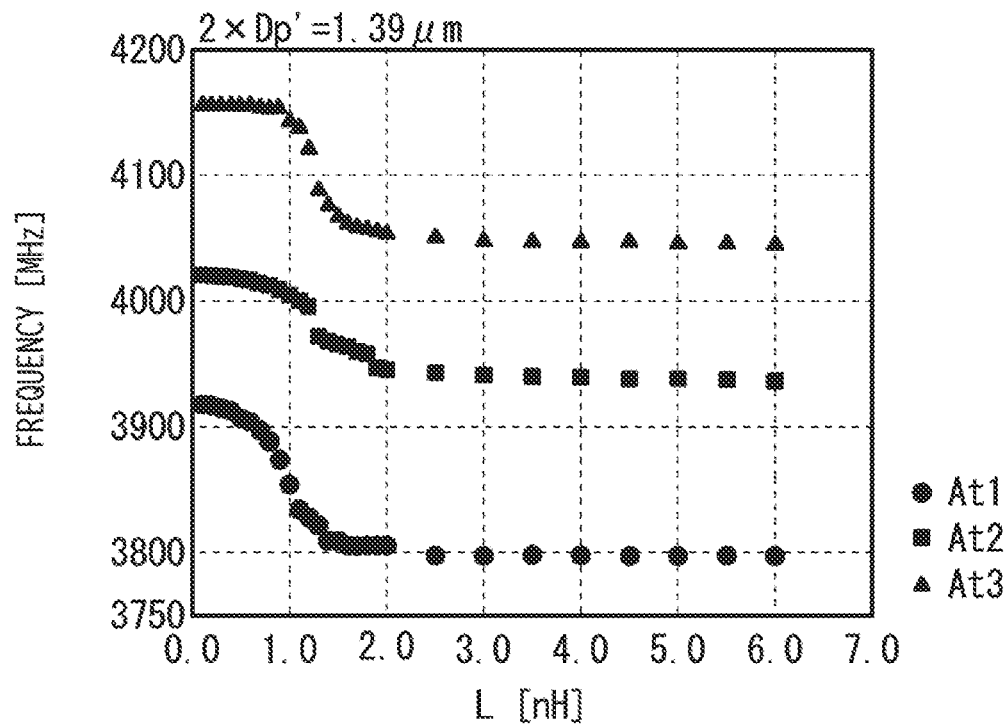

FIGS. 10A and 10B are diagrams illustrating the attenuation amounts and the frequencies of poles At1 to At3 with respect to the inductance of the inductor L in the simulation 2. As illustrated in FIG. 10A, when the inductance increases from 0.1 nH, the attenuation amounts of the poles At1 to At3 increase. The attenuation amounts become maximum when the inductance is around 1 nH. As the inductance increases from 1 nH, the attenuation amounts decrease. When the inductance is 6 nH, the attenuation amounts are approximately −0.1 dB. In order to secure the attenuation amounts of the poles At1 to At3, the inductance of the inductor L is preferably 6.0 nH or less, and more preferably 3.0 nH or less.

As illustrated in FIG. 10B, when the inductance increases from 0.1 nH and becomes about 0.5 nH or more, the frequencies of the poles At1 to At3 begin to decrease. When the inductance exceeds about 2 nH, the frequencies of the poles At1 to At3 hardly change even if the inductance increases. In order to change the frequencies of the poles At1 to At3, the inductance of the inductor L is preferably 0.5 nH or more, and more preferably 0.7 nH or more. As described above, the attenuation amounts and frequencies of the poles At1 to At3 can be changed by changing the inductance of inductor L.

Next, the inductance of the inductor L was set to 0 nH, the 2×pitch Dp' of the resonator P' was changed, and the passage characteristics of the circuit 46 were simulated. Other simulation conditions are the same as those in the simulation 1.

Figure 11A:
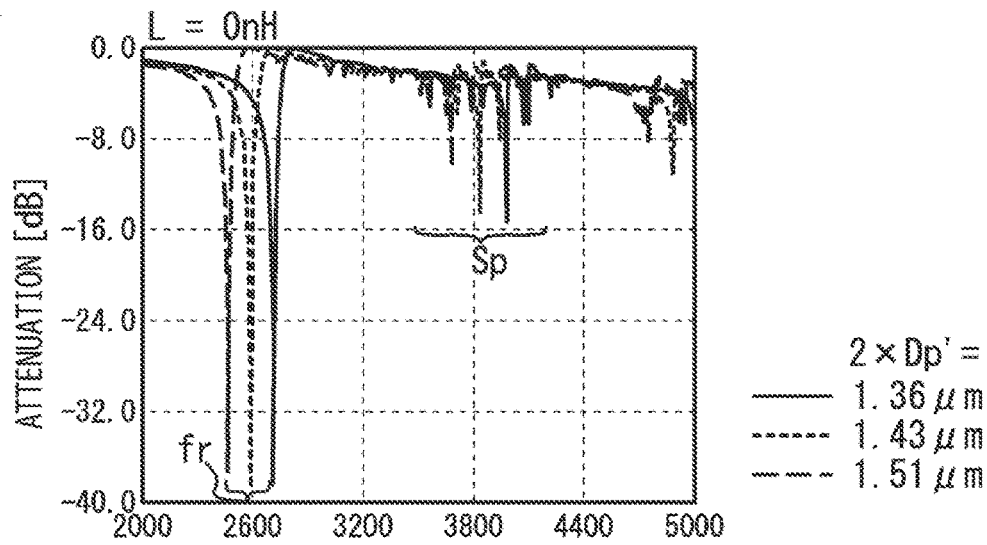
FIGS. 11A and 11B are diagrams illustrating the passage characteristics of the circuit 46 in the simulation 2.
Figure 11B:
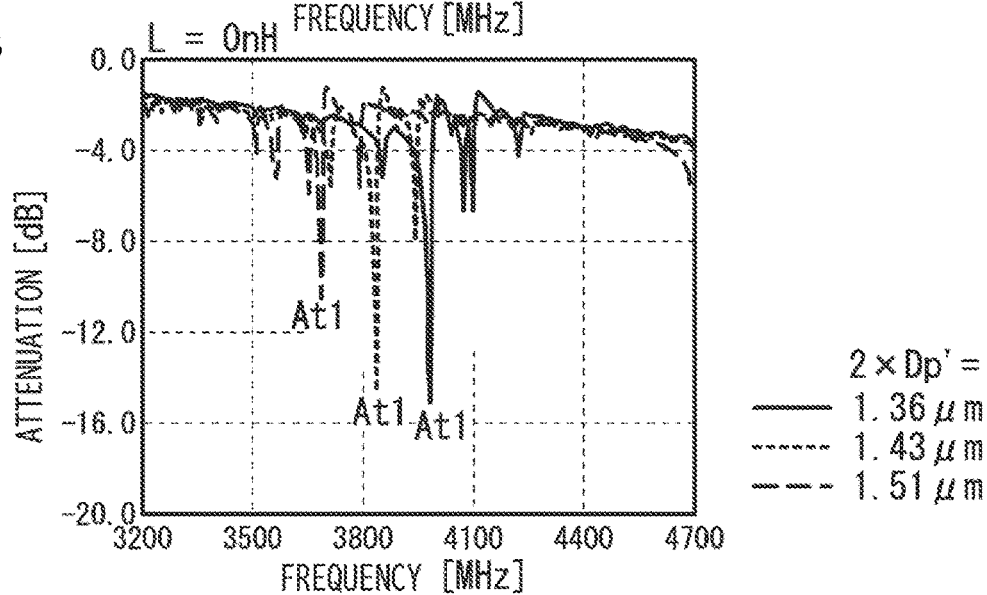
Figure 11C:
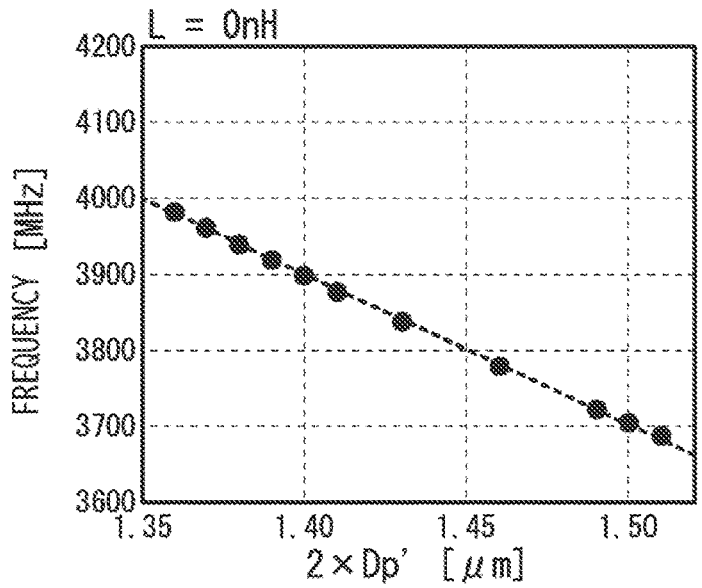
FIG. 11C is a diagram illustrating a frequency of a pole Sp1 with respect to 2×pitch Dp'.

FIGS. 11A and 11B are diagrams illustrating the passage characteristics of the circuit 46 in the simulation 2. FIG. 11C is a diagram illustrating a frequency of the pole Sp1 with respect to 2×pitch Dp'. FIG. 11B is an enlarged view illustrating the vicinity of the spurious response of FIG. 11A.

The 2×pitch Dp' of the resonator P' is 1.36 μm, 1.43 μm and 1.51 μm. The dots in FIG. 11C are simulation points, and the straight line is a linear approximation using a least squares method.

As illustrated in FIGS. 11A and 11B, when the 2×pitch Dp' of the resonator P' becomes large, the resonance frequency fr becomes low, and the frequency of the pole At1 of the spurious response Sp becomes low. Even if 2×pitch Dp' is changed, the attenuation amounts of the pole At1 are almost unchanged. The shift amount of the resonance frequency fr and the shift amount of the pole At1 with respect to the change of 2×pitch Dp' of the resonator P' are about the same.

As illustrated in FIG. 11C, as the 2×pitch Dp' of the resonator P' increases, the frequency of the pole At1 decreases. The linear approximation is represented by "frequency of pole At1=−1971.2×2×Dp'+6660.3". When 2×pitch Dp' is increased by 0.005 μm, the frequency of the pole At1 shifts by about 10 MHz. In this way, when the 2×pitch Dp' of the resonator P' is changed, the attenuation amounts of the pole At1 are almost unchanged, but the frequencies of the pole At1 can be shifted to the same degree as the resonance frequencies fr.

An embodiment based on the above findings will be described below.

Figure 12:
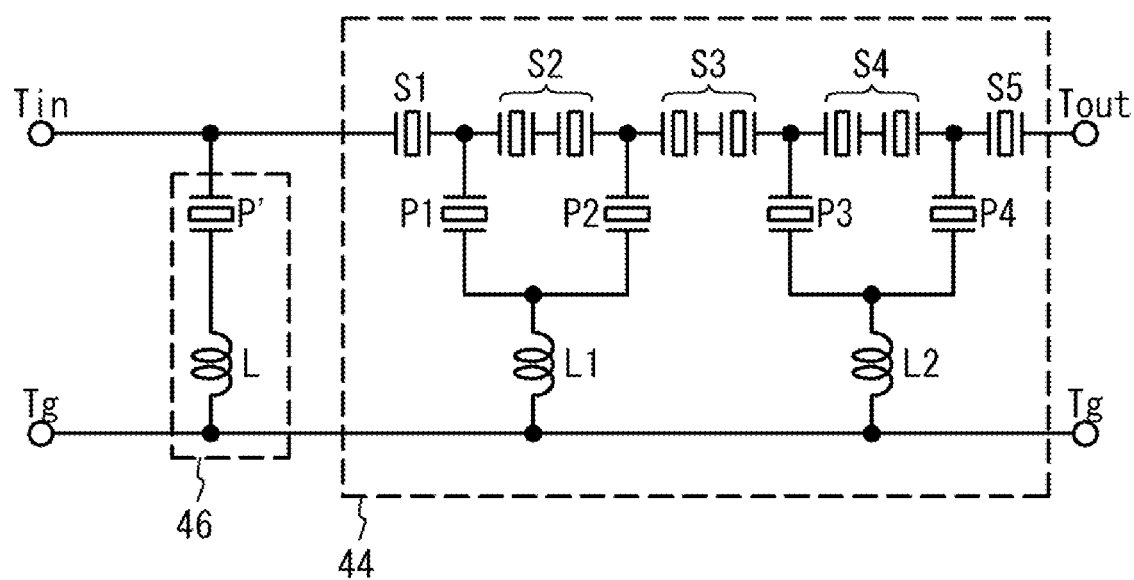
FIG. 12 is a circuit diagram illustrating a filter according to a first embodiment.

FIG. 12 is a circuit diagram illustrating a filter according to a first embodiment. As illustrated in FIG. 12, a ladder type filter 44 is connected between the input terminal Tin and the output terminal Tout. The ladder type filter 44 includes the series resonators S1 to S5, the parallel resonators P1 to P4, and the inductors L1 and L2, as in the ladder type filter F of FIG. 4. The inductors L1 and L2 are parasitic inductances. The circuit 46 is connected between the ladder type filter 44 and the input terminal Tin. The circuit 46 includes the resonator P' and the inductor L as in FIG. 8.

Figure 13:
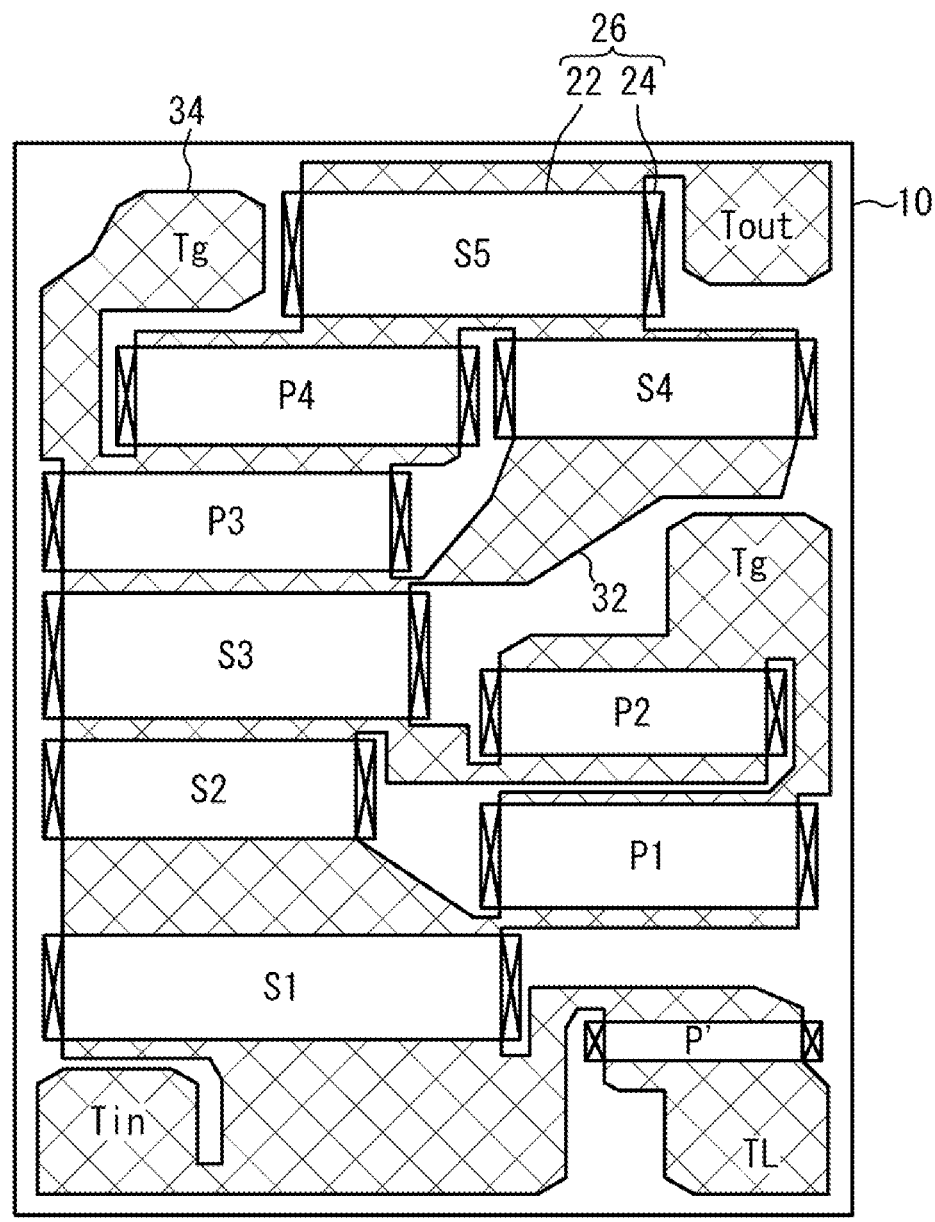
FIG. 13 is a plan view illustrating a part of the filter according to the first embodiment formed on a chip.

FIG. 13 is a plan view illustrating a part of the filter according to the first embodiment formed on a chip. As illustrated in FIG. 13, the support substrate 10 is provided with the acoustic wave resonator 26 having the IDT 22 and the reflectors 24. The acoustic wave resonator 26 includes the series resonators S1 to S5, the parallel resonators P1 to P4, and the resonator P'. A wiring 32 and a pad 34 are provided on the support substrate 10. The wiring 32 is connected between the acoustic wave resonators 26, and connects the acoustic wave resonator 26 to the pad 34. The wiring 32 and the pad 34 are metal layers such as a gold layer, a copper layer, or an aluminum layer. The pad 34 is electrically connected to the input terminal Tin, the output terminal Tout, the ground terminal Tg, and the inductor terminal TL. The inductor terminal TL corresponds to the node between the resonator P' and the inductor L in the circuit 46. The inductor L is provided outside the chip. The inductor L is formed, for example, by wirings provided on a mounting board on which the chip is mounted. The inductor L may be a chip component.

(Simulation 3)

The passage characteristics of the filter according to the first embodiment were simulated. The simulation conditions are as follows.

Filter F1
    2×pitch Ds of series resonator S: 1.390 μm
    2×pitch Dp of parallel resonator P: 1.500 μm
    2×pitch Dp' of resonator P': 1.395 μm
    Inductors L1, L2: 0.1 nH
    Inductor L: 3.0 nH Filter F2
    2×pitch Ds of series resonator S: 1.390 μm
    2×pitch Dp of parallel resonator P: 1.500 μm
    2×pitch Dp' of resonator P': 1.500 μm
    Inductors L1, L2: 0.1 nH
    Inductor L: 3.0 nH
    Other simulation conditions are the same as those in the simulation 1.

In the filter F1, the pitch Dp' of the resonator P' is substantially the same as the pitch Ds of the series resonator S, which corresponds to the first embodiment. In the filter F2, the pitch Dp' of the resonator P' is substantially the same as the pitch Dp of the parallel resonator P, which corresponds to the first comparative example.

Figure 14A:
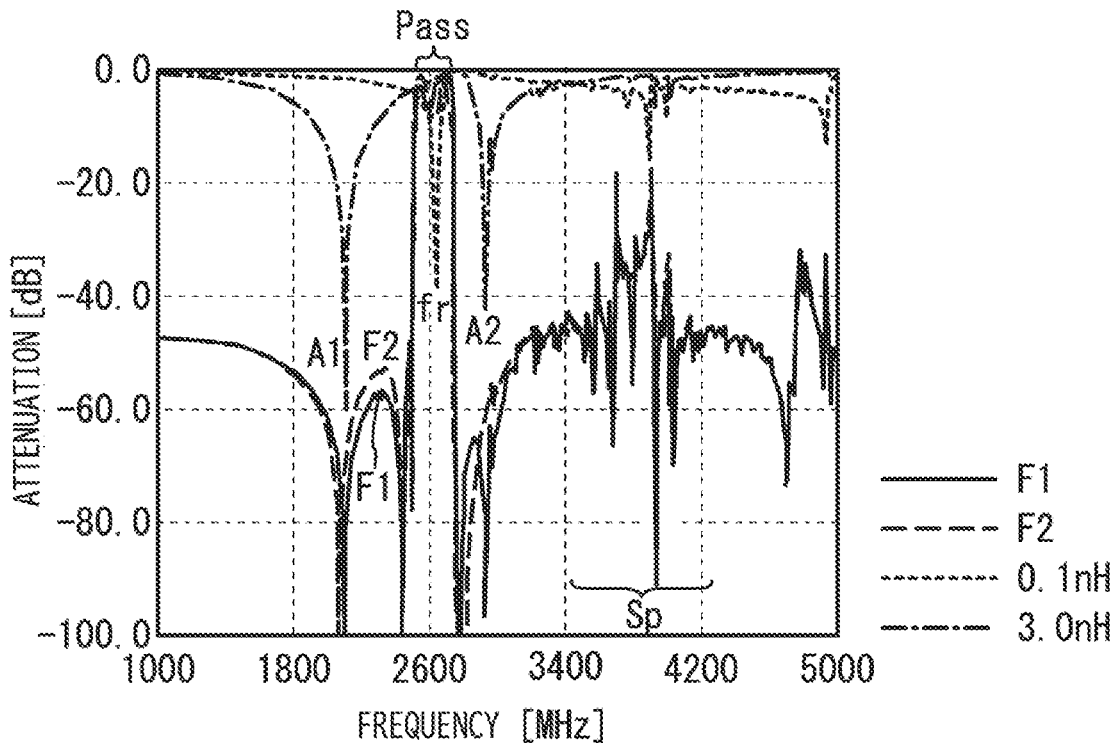
FIGS. 14A and 14B are diagrams illustrating the passage characteristics of the filters F1, F2 and the circuit 46 in a simulation 3.
Figure 14B:
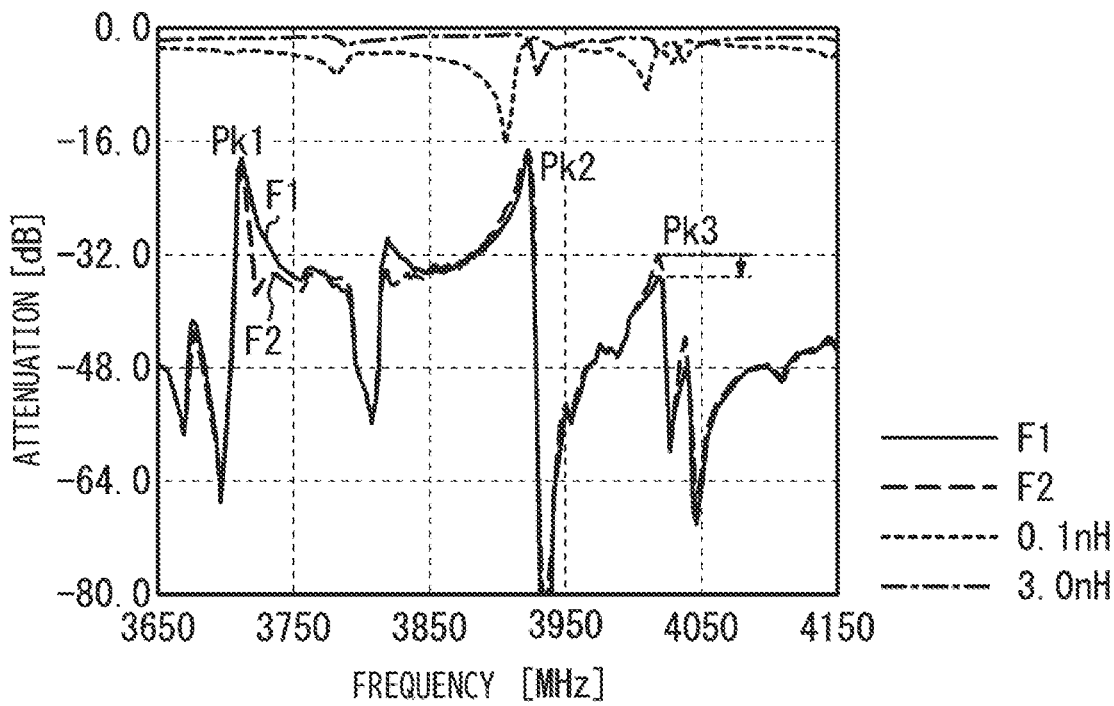

FIGS. 14A and 14B are diagrams illustrating the passage characteristics of the filters F1, F2 and the circuit 46 in a simulation 3. FIG. 14B is an enlarged view illustrating the vicinity of the spurious response of FIG. 14A. In the resonator P' having a 2×pitch Dp' of 1.395 μm, the passage characteristics of the circuit 46 in which the inductance of the inductor L is 0.1 nH and the passage characteristics of the circuit 46 in which the inductance of the inductor L is 3.0 nH are also illustrated.

As illustrated in FIG. 14A, the filters F1 and F2 have a pass band Pass at about 2600 MHz. The spurious response Sp occurs at 3400 MHz to 4200 MHz. As illustrated in FIG. 14B, in the filters F1 and F2, three peaks Pk1 to Pk3 are formed in the spurious response Sp. The peak Pk1 is mainly formed by the spurious response of the parallel resonator P, and the peaks Pk2 and Pk3 are mainly formed by the spurious response of the series resonator S. The filter F1 can have a larger attenuation amount of the peaks Pk2 and Pk3 than the filter F2. For example, in the filter F1, the attenuation amount of the peak Pk3 is about 3.0 dB larger than that of the filter F2 as illustrated by a downward arrow.

In the filter F1 of the first embodiment, the pitch Dp' of the resonator P' is substantially the same as the pitch Ds of the series resonator S. Thereby, the peak of the spurious response of the series resonator S can be compensated for by the notch of the spurious response of the resonator P', as illustrated in FIG. 7C of Simulation 1. Thereby, the peak of the spurious response can be made smaller than in a case where the pitch Dp' of the resonator P' is the same as the pitch Dp of the parallel resonator P as in the filter F02.

When the inductance of the inductor L is about the parasitic inductance as in L=0.1 nH in FIG. 14A, the resonance frequency fr of the resonator P' is located within the pass band Pass, and the notch is formed in the pass band Pass. Therefore, the inductance of the inductor L is increased. Thereby, the attenuation poles A1 and A2 of the circuit 46 are formed at frequencies lower and higher than the pass band Pass as illustrated in L=3.0 nH in FIG. 14A. Therefore, it is possible to suppress the formation of the notch caused by the circuit 46 in the pass band Pass.

When the inductance of the inductor L becomes large as illustrated in FIG. 10B of the simulation 1, the frequency of the spurious response of the resonator P' changes. Therefore, as illustrated in FIG. 11C, the pitch Dp' of resonator P' is adjusted so that the notch in the spurious response of the resonator P' can compensate for the peak of the spurious response of the series resonator S. As illustrated in FIG. 10B, when the inductance of the inductor L is increased, the spurious response shifts to a low frequency side. In order to compensate for this, it is considered that the pitch Dp' of the resonator P' is smaller than the pitch Ds of the series resonator S, as illustrated in FIG. 11C. In practice, however, the pitch Dp' of the resonator P' is adjusted so that the peak of the spurious response in the filter F01 become low in the vicinity of the pitch Ds of the series resonator S. Therefore, the pitch Dp' of the resonator P' may be larger than the pitch Ds of the series resonator S.

According to the first embodiment, the average pitches Ds (a first average pitch) of the electrode fingers 18 (first electrode fingers) in the series resonators S1 to S5 are made larger than the average pitches Dp (a second average pitch) of the electrode fingers 18 (second electrode fingers) in the parallel resonators P1 to P4. When the average pitches Ds are different from each other in the series resonators S1 to S5 and the average pitches Dp are different from each other in the parallel resonators P1 to P4, a minimum average pitch Dpmin is larger than a maximum average pitch Dsmax. Thereby, a bandpass filter is formed by the series resonators S1 to S5 and the parallel resonators P1 to P4. When the piezoelectric layer 14 is provided on the support substrate 10, the spurious responses Sp0 and Sp are generated as illustrated in FIGS. 3B and 3C. The average pitch D of the acoustic wave resonator 26 can be calculated by dividing the width of the IDT 22 in the X direction by the number of electrode fingers 18.

Therefore, the average pitch Dp' of the electrode fingers 18 of the resonator P' is set to be close to the average pitches Ds in the series resonators S1 to S4. That is, the average pitch Dp' of the resonator P' is set to an intermediate value (Dpmin+Dsmax)/2 or less between the maximum average pitch Dsmax in the series resonators S1 to S4 and the minimum average pitch Dpmin in the parallel resonators P1 to P4. Thereby, the notch of the spurious response of the resonator P' compensates for the peak of the spurious response of the series resonators S1 to S5. However, the notch due to the resonance frequency fr of the resonator P' is formed in the pass band Pass.

Therefore, the inductor L having one end connected to an end near the ground of the resonator P' and the other end connected to the ground is provided. The inductance of the inductor L is more than the maximum inductance of the inductors L1 and L2 connected between the parallel resonators P1 to P4 and the ground. This suppresses forming the attenuation poles A1 and A2 due to the resonant frequency fr of the resonator P' on both sides of the pass band Pass, and forming the notch in the pass band Pass. As illustrated in FIG. 10B, the frequency of the high frequency spurious response of the resonator P' is changed by the inductor L. Therefore, the average pitch Dp' of the resonator P' is finely adjusted, so that the notch of the spurious response of the resonator P' compensates for the peak of the spurious response of the series resonators S1 to S5. This allows the reduction of the attenuation amount due to the spurious response of the series resonators S1 to S5 to be suppressed.

In order to set the average pitch Dp' of the resonator P' near the average pitch Ds of the series resonators S1 to S5, the average pitch Dp' of the resonator P' is preferably Dsmax+(Dpmin−Dsmax)/3 or less. Further, the average pitch Dp' of the resonator P' is preferably Dsmin−(Dpmin−Dsmax)/2 or more, and more preferably Dsmin−(Dpmin−Dsmax)/3 or more.

As illustrated in FIG. 10B, the frequency change of the spurious response due to the inductor L is very small. Therefore, the average pitch Dp' of the resonator P' is preferably 1.02 times or less than the maximum average pitch Dsmax and 0.98 times or more than the minimum average pitch Dsmin. The average pitch Dp' of the resonator P' is more preferably 1.015 times or less, and further preferably 1.01 times or less than the maximum average pitch Dsmax. The average pitch Dp' is more preferably 0.985 times or more, and further preferably 0.99 times or more than the minimum average pitch Dsmin.

As illustrated in FIG. 14A, in order to locate the attenuation poles A1 and A2 due to the resonance frequency fr of the resonator P' outside the pass band, the inductance of the inductor L is preferably 5 times or more, and more preferably 10 times or more than the maximum inductance of the inductors L1 and L2. Thereby, even when the resonance frequency fr of the resonator P' alone is located within the pass band Pass, the attenuation poles A1 and A2 due to the resonance frequency of the resonator P' to which the inductor L is connected are not located within the pass band Pass. When the inductors L1 and L2 have the parasitic inductances, the inductances of the inductors L1 and L2 are 0.1 nH. Therefore, the inductance of the inductor L is preferably 0.5 nH or more, and more preferably 1.0 nH or more.

As illustrated in FIG. 10A, if the inductance of the inductor L is too large, the notch of the spurious response of the resonator P' becomes small. From this viewpoint, the inductance of the inductor L is preferably 100 times or less, more preferably 50 times or less, and still more preferably 20 times or less than the maximum inductance of the inductors L1 and L2.

When the average pitches Ds of the series resonators S1 to S5 are substantially equal, the spurious responses of the series resonators S1 to S5 overlap with each other, and the peak of the spurious responses becomes large. Therefore, when the maximum average pitch Ds is Dsmax and the minimum average pitch Ds is Dsmin, and (Dsmax−Dsmin)/(Dsmax+Dsmin) is 0.01 or less or 0.005 or less, it is preferable to provide the circuit 46.

Second Embodiment

Figure 15:
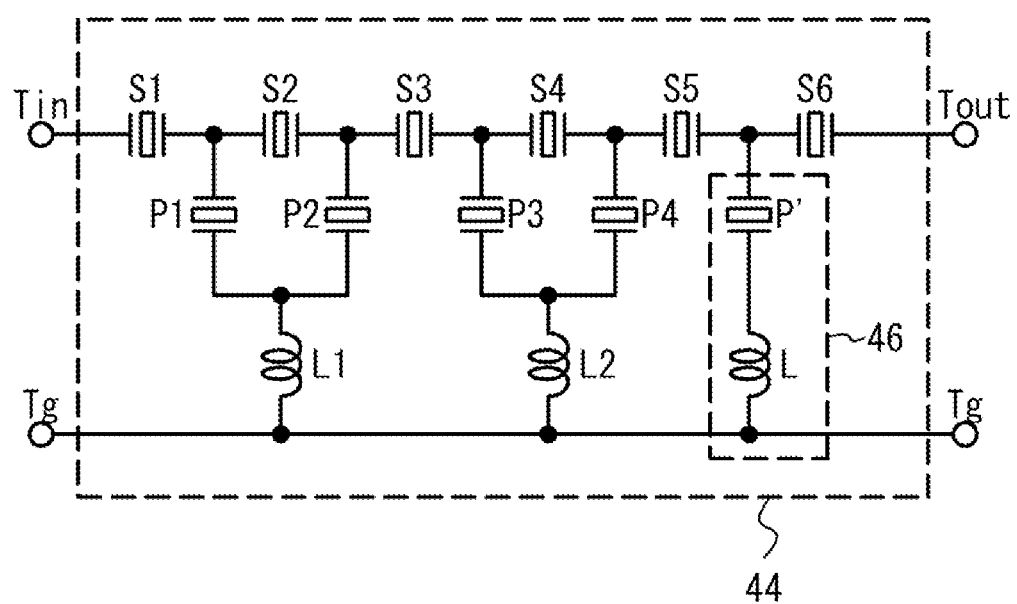
FIG. 15 is a circuit diagram illustrating a filter according to a second embodiment.

FIG. 15 is a circuit diagram illustrating a filter according to a second embodiment. As illustrated in FIG. 15, the ladder type filter 44 is connected between the input terminal Tin and the output terminal Tout. The ladder type filter 44 includes the series resonators S1 to S6, the parallel resonators P1 to P4, and the inductors L1 and L2. The circuit 46 is connected between the series resonators S5 and S6. The circuit 46 includes the resonator P' and the inductor L as in FIG. 8.

(Simulation 4)

The passage characteristics of the filter according to the second embodiment were simulated. The simulation conditions are as follows.

Filter F3
  2×pitch Ds of series resonator S: 1.400 μm
  2×pitch Dp of parallel resonator P: 1.500 μm
  2×pitch Dp' of resonator P': 1.490 μm
  Inductors L1, L2: 0.1 nH
  Inductor L: 0.9 nH Filter F4
  2×pitch Ds of series resonator S: 1.400 μm
  2×pitch Dp of parallel resonator P: 1.500 μm
  2×pitch Dp' of resonator P': 1.500 μm
  Inductors L1, L2: 0.1 nH
  Inductor L: 0.9 nH
  Other simulation conditions are the same as those in the simulation 1.

In the filter F3, the pitch Dp' of the resonator P' is slightly smaller than the pitch Dp of the parallel resonator P, which corresponds to the second embodiment. In the filter F4, the pitch Dp' of the resonator P' is the same as the pitch Dp of the parallel resonator P, which corresponds to the second comparative example.

Figure 16A:
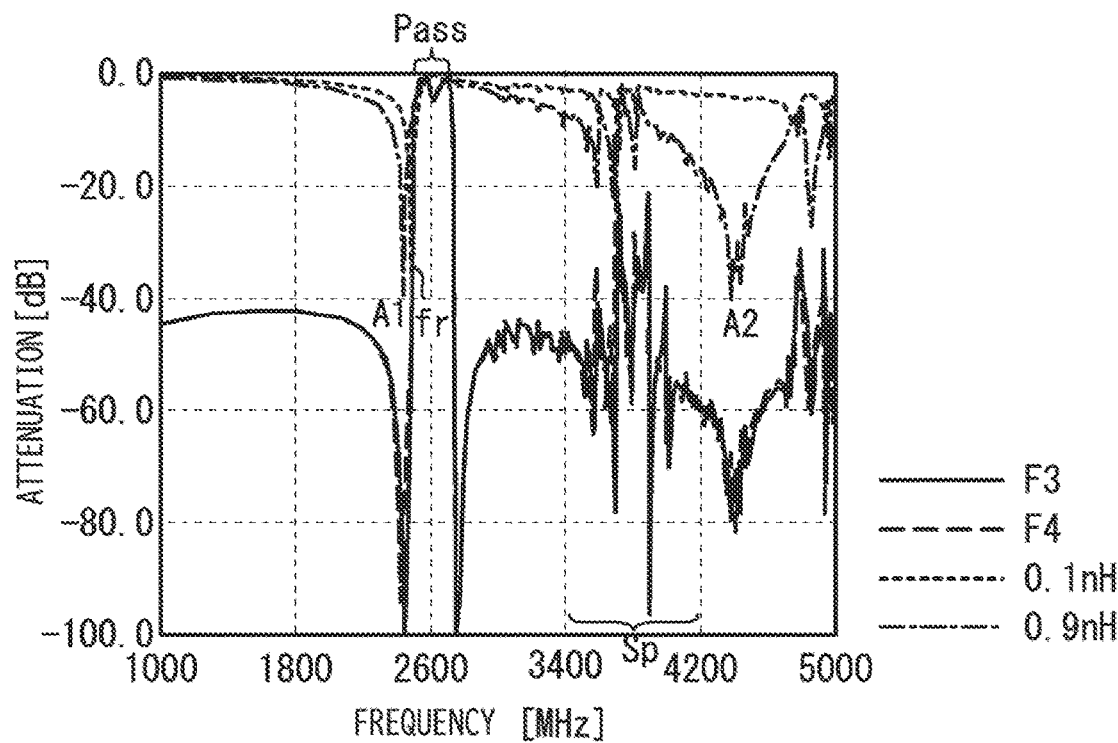
FIGS. 16A and 16B are diagrams illustrating the passage characteristics of filters F3, F4 and the circuit 46 in a simulation 4.
Figure 16B:
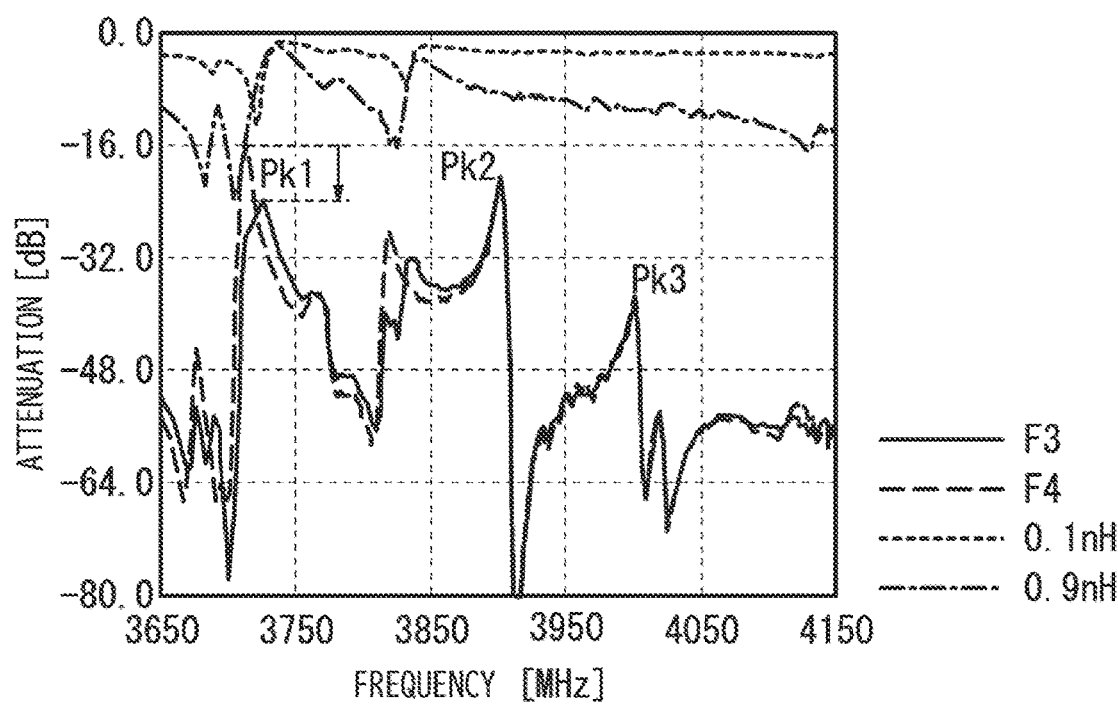
Figure 17:
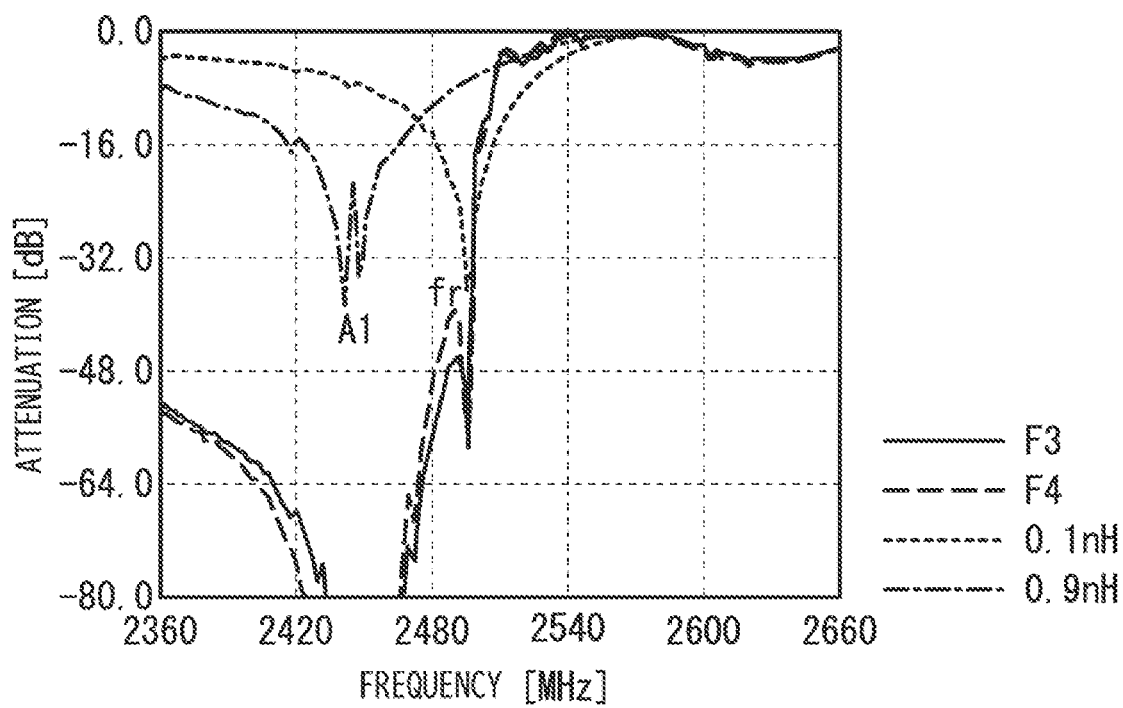
FIG. 17 is a diagram illustrating the passage characteristics of filters F3, F4 and the circuit 46 in the simulation 4.

FIGS. 16A and 16B, and FIG. 17 are diagrams illustrating the passage characteristics of the filters F3, F4 and the circuit 46 in a simulation 4. FIG. 16B is an enlarged view illustrating the vicinity of the spurious response of FIG. 16A. FIG. 17 is an enlarged view illustrating the vicinity of a low frequency end of the pass band Pass of FIG. 16A. In the resonator P' having the 2×pitch Dp' of 1.490 µm, the passage characteristics of the circuit 46 in which the inductance of the inductor L is 0.1 nH and the pass characteristics of the circuit 46 in which the inductance of the inductor L is 0.9 nH are illustrated.

As illustrated in FIG. 16A, the filters F3 and F4 have the pass band Pass at about 2600 MHz. The spurious response Sp occurs at 3400 MHz to 4200 MHz. As illustrated in FIGS. 16A and 17, the resonance frequency fr of the resonator P' having the inductance L=0.1 nH is located at a low frequency end of the pass band Pass. The attenuation poles A1 and A2 due to the resonance frequency fr of the resonator P' having the inductance L=0.9 nH are located at frequencies lower and higher than the pass band Pass, respectively. As illustrated in FIG. 16B, the filter F3 can lower the peak Pk1 formed by the spurious response of the parallel resonators P1 to P4, compared with the filter F4. For example, in the filter F3, the attenuation amount of the peak Pk1 is about 8.2 dB larger than that of the filter F4, as illustrated by a downward arrow.

In the filter F3 of the second embodiment, the pitch Dp' of the resonator P' is slightly different from the pitch Dp of the parallel resonator P. Thereby, the notch of the spurious response of the resonator P' overlaps with the peak of the spurious response of the parallel resonators P1 to P4. This allows the peak Pk1 formed by the spurious response of the parallel resonators P1 to P4 to be lowered, as in the filter F3 of FIG. 16B.

However, if the pitch Dp' of the resonator P' is made smaller than the pitch Dp of the parallel resonator P, when the inductance of the inductor L is about the parasitic inductance as in L=0.1 nH in FIG. 17, the resonance frequency fr of the resonator P' overlaps with the low frequency end of the pass band Pass. Thereby, the pass band Pass may be narrowed. Therefore, the inductance of the inductor L is increased. As a result, the attenuation poles A1 and A2 of the circuit 46 are formed at frequencies lower and higher than the pass band Pass as in L=0.9 nH in FIGS. 16A and 17, respectively. Therefore, it is possible to suppress the formation of the notch caused by the circuit 46 in the pass band Pass.

According to the second embodiment, the average pitch Dp' (third average pitch) of the electrode fingers 18 of the resonator P' is made smaller than the minimum average pitch Dsmin of the parallel resonators P1 to P4, and is set to an intermediate value (Dpmin+Dsmax)/2 or more between the average pitch Dsmax and the average pitch Dpmin. Thereby, the peak Pk1 mainly formed by the spurious response of the parallel resonators P1 to P4 can be lowered. However, the attenuation pole due to the resonance frequency fr of the resonator P' is located within the pass band Pass. Therefore, the inductance of the inductor L is made larger than the maximum inductance of the inductors L1 and L2 connected between the parallel resonators P1 to P4 and the ground. Thereby, even when the resonance frequency fr of the resonator P' alone is located within the pass band Pass, the attenuation poles A1 and A2 due to the resonance frequency of the resonator P' to which the inductor L is connected are not located within the pass band Pass.

The inductance of the inductor L is more preferably 5 times or more, and still more preferably 8 times or more than the maximum inductance of the inductors L1 and L2. The inductance of the inductor L is preferably 0.5 nH or more, and more preferably 0.8 nH or more. Thereby, even when the resonance frequency fr of the resonator P' alone is located within the pass band Pass, the attenuation poles A1 and A2 due to the resonance frequency of the resonator P' to which the inductor L is connected are not located within the pass band Pass.

When the inductance of the inductor L is too large, the notch of the spurious response becomes small. From this viewpoint, the inductance of the inductor L is preferably 100 times or less, more preferably 50 times or less, and still more preferably 20 times or less the maximum inductance of the inductors L1 and L2.

When the average pitches Dp of the parallel resonators P1 to P4 are substantially equal to each other, the spurious responses of the parallel resonators P1 to P4 overlap with each other, and hence the peak of the spurious response becomes large. Therefore, when the maximum average pitch Dp is Dpmax and the minimum average pitch Dp is Dpmin, and (Dpmax−Dpmin)/(Dpmax+Dpmin) is 0.01 or less or 0.005 or less, it is preferable to provide the circuit 46. Further, a difference Dpmin−Dp' is preferably larger than a difference Dpmax−Dpmin. The difference Dpmin−Dp' is more preferably 2 times or more, and still more preferably 3 times or more than the difference Dpmax−Dpmin.

Observing the waveform of the spurious response of the parallel resonator P in FIG. 7C, it is sufficient to shift the notch of the spurious response of resonator P' to the high frequency side by about 10 MHz to 20 MHz in order to shift the notch of the spurious response of resonator P' to the peak of the spurious response of the parallel resonator P. As illustrated in FIG. 11C, if the 2×pitch Dp' is reduced by 0.002 the notch of the spurious response of the resonator P' shifts to the high frequency side by 10 MHz. Therefore, the average pitch Dp' of the resonator P' is 0.98 times or more and 0.99 times or more than the Dpmin. Further, the average pitch Dp' of the resonator P' is more preferably Dpmin−(Dpmin−Dpmax)/3 or more.

In the first and the second embodiments, when the thickness T4 of the piezoelectric layer 14 is twice or less (that is, 1λ or less) the maximum average pitch Dpmax of the parallel resonators P1 to P4, the strong spurious response Sp is generated at some frequencies as illustrated in FIG. 3C. In this case, the spurious response can be more suppressed by providing the circuit 46. The number of series resonators may be one or more, and the number of parallel resonators may be one or more.

Third Embodiment

Figure 18:
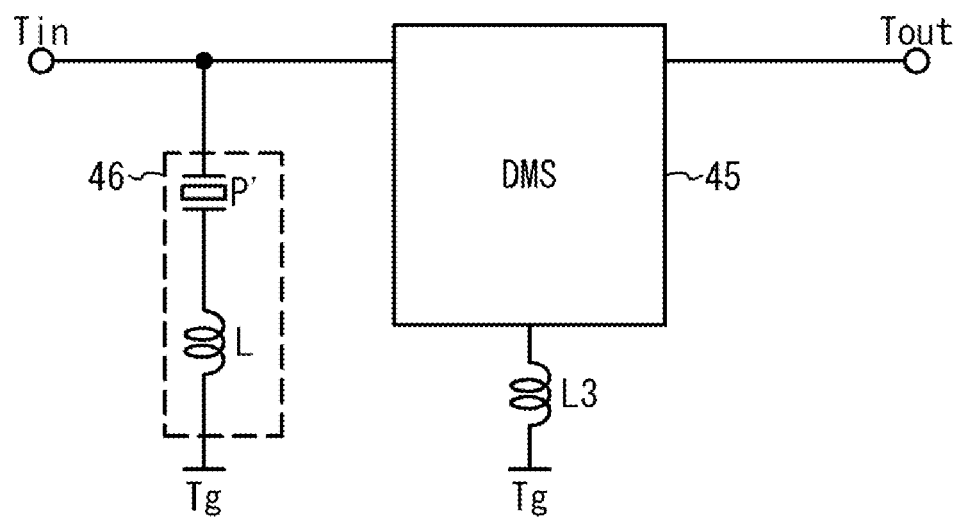
FIG. 18 is a circuit diagram illustrating a filter according to a third embodiment.

FIG. 18 is a circuit diagram illustrating a filter according to a third embodiment. As illustrated in FIG. 18, a DMS (Double Mode Surface Acoustic Wave) filter 45 is connected between the input terminal Tin and the output terminal Tout. The DMS filter 45 is grounded via the inductor L3. The inductor L3 is a parasitic inductance, for example, 0.1 nH or less. The circuit 46 is connected between the DMS filter 45 and the input terminal Tin. The circuit 46 includes the resonator P' and the inductor L as in FIG. 8.

Figure 19:
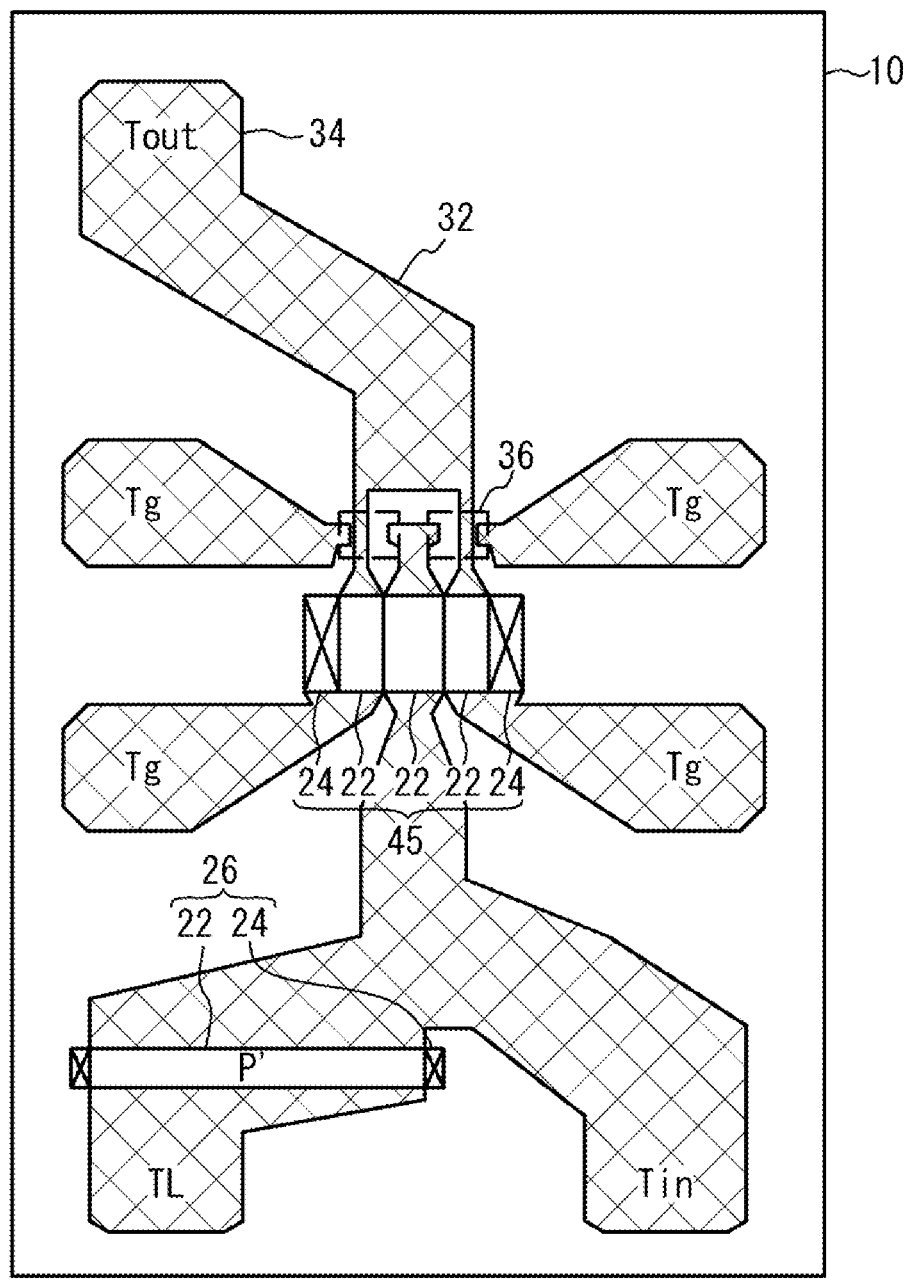
FIG. 19 is a plan view illustrating a part of the filter according to the third embodiment formed on the chip.

FIG. 19 is a plan view illustrating a part of the filter according to the third embodiment formed on the chip. As illustrated in FIG. 19, the DMS filter 45 and the acoustic wave resonator 26 are provided on the support substrate 10. In the DMS filter 45, three IDTs 22 are arranged, and the reflectors 24 are provided on both sides of the three IDTs. The acoustic wave resonator 26 includes the resonator P'.

The wirings 32, 36 and the pad 34 are provided on the support substrate 10. The wirings 32 and 36 connect the DMS filter 45 and the acoustic wave resonator 26, and connect the DMS filter 45 and the acoustic wave resonator 26 to the pad 34. The wiring 36 intersects with the wiring 32 via an insulating layer. The pad 34 is electrically connected to the input terminal Tin, the output terminal Tout, the ground terminal Tg, and the inductor terminal TL.

(Simulation 5)

First, the following DMS filter 45 without the circuit 46 was manufactured and the passage characteristics of the DMS filter 45 were measured.

Support substrate 10: Sapphire substrate having a thickness of 500 μm
Boundary layer 11: Aluminum oxide layer having a thickness of 5 μm
Temperature compensation film 12: None
Piezoelectric layer 14: 42° Y-cut X-propagation lithium tantalate layer having a thickness of 0.9 μm
Metal film 16: Titanium film having a thickness of 10 nm and Aluminum film having a thickness of 129 nm arranged in this order from the piezoelectric layer 14
Protective film: Silicon oxide film having a thickness of 15 nm
Interface between the support substrate 10 and the boundary layer 11: Rough surface
2×pitch Dd of IDT 22: 2.00 μm The passage characteristics of the filter F5 according to the third embodiment were simulated based on the measured passage characteristics of the DMS filter 45. The simulation conditions are as follows.

Filter F5
Characteristics of DMS filter 45: Characteristics of actually measured DMS Conditions of resonator P'
Support substrate 10: Sapphire substrate having a thickness of 30 μm
Boundary layer 11: Aluminum oxide layer having a thickness of 5 μm
Temperature compensation film 12: None
Piezoelectric layer 14: 42° Y-cut X-propagation lithium tantalate layer having a thickness of 0.9 μm
Metal film 16: Titanium film having a thickness of 10 nm and Aluminum film having a thickness of 129 nm arranged in this order from the piezoelectric layer 14
Protective film: None
Interface between the support substrate 10 and the boundary layer 11: Mirror surface
2×pitch Dp' of resonator P': 2.03 μm
Inductor L3: 0.1 nH or less (corresponding to the parasitic inductance at the time of actual measurement)
Inductor L: 3.0 nH Filter F6
Measured DMS filter 45

The filter F5 is provided with the circuit 46 and corresponds to the third embodiment. The filter F6 is not provided with the circuit 46 and corresponds to a third comparative example.

Figure 20A:
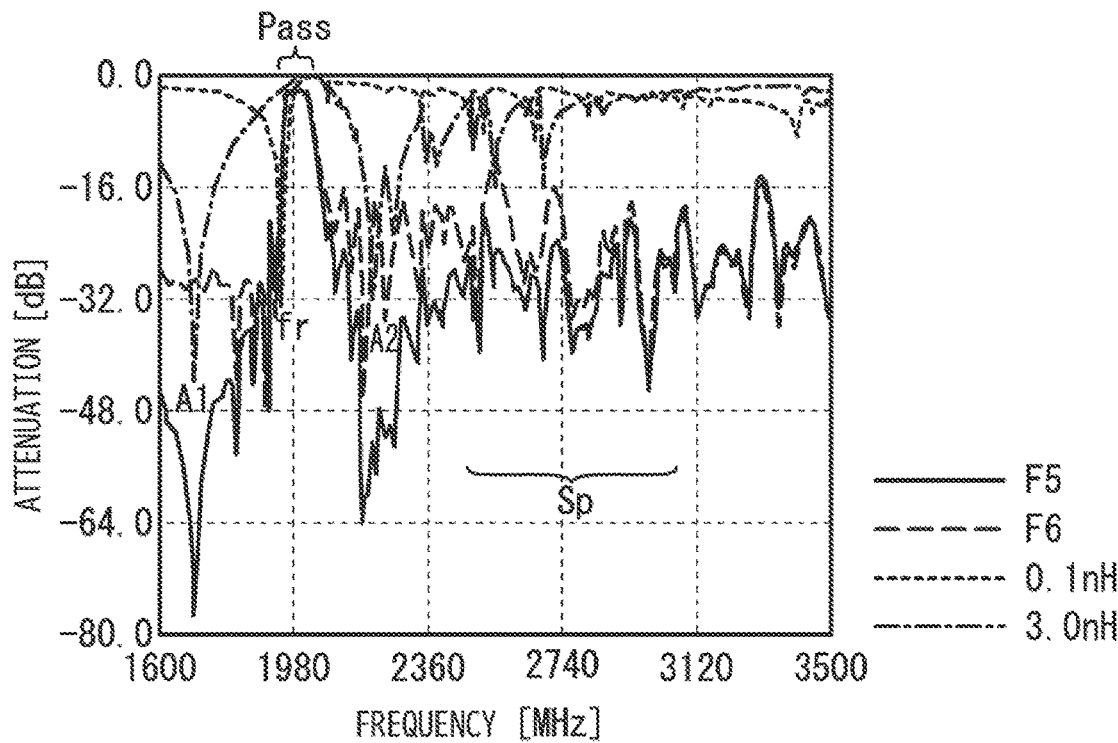
FIGS. 20A and 20B are diagrams illustrating the passage characteristics of filters F5, F6 and the circuit 46 in a simulation 5.
Figure 20B:
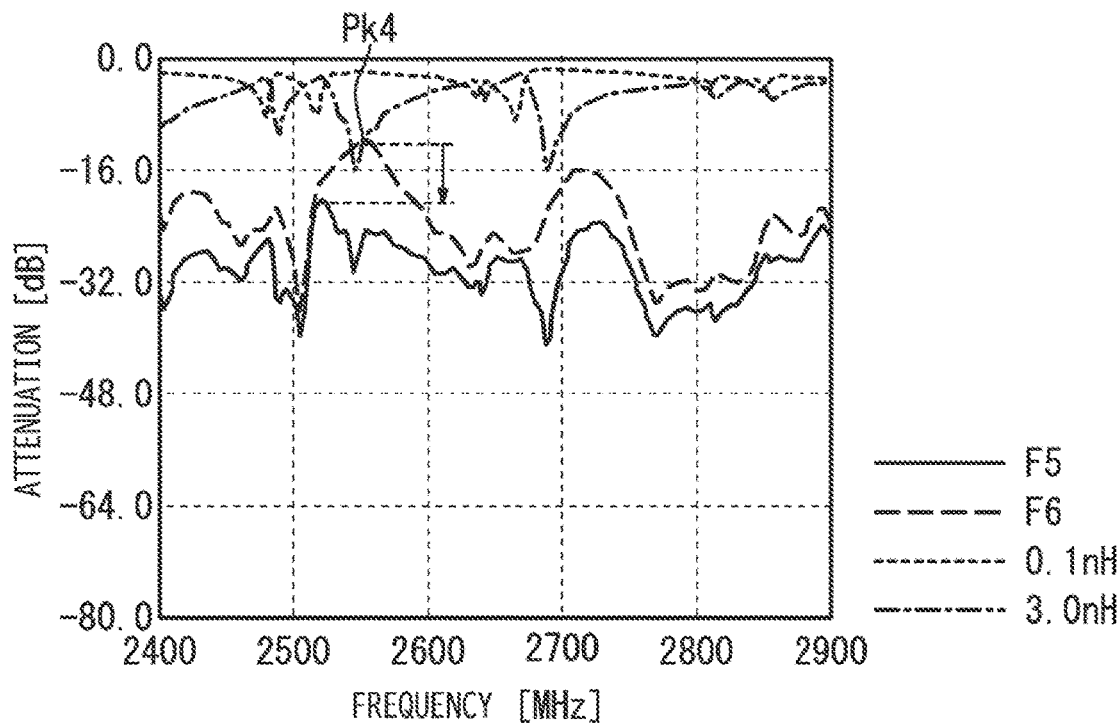

FIGS. 20A and 20B are diagrams illustrating the passage characteristics of filters F5, F6 and the circuit 46 in a simulation 5. FIG. 20B is an enlarged view illustrating the vicinity of the spurious response of FIG. 20A. In the resonator P' having 2×pitch Dp' of 2.03 μm, the passage characteristics of the circuit 46 in which the inductance of the inductor L is 0.1 nH and the passage characteristics of the circuit 46 in which the inductance of the inductor L is 3.0 nH are also illustrated.

As illustrated in FIG. 20A, the filters F5 and F6 have a pass band Pass at about 2000 MHz. The spurious response Sp occurs from 2500 MHz to 3000 MHz. As illustrated in FIG. 20B, the filter F5 can lower the peak of the spurious response Sp compared with the filter F6. For example, in the filter F5, the attenuation amount of the peak Pk4 is about 8.5 dB larger than that of the filter F6 as illustrated by a downward arrow.

In the filter F5 of the third embodiment, the pitch Dp' of the resonator P' is slightly different from the pitch Dd of the DMS filter 45. Thereby, the notch of the spurious response of the resonator P' overlaps with the peak of the spurious response of the DMS filter 45. Thereby, the attenuation amount at the peak of the spurious response of the DMS filter 45 can be increased as in the filter F5 of FIG. 20B.

However, if the pitch Dp' of the resonator P' is the pitch Dd of the DMS filter 45 or its vicinity, when the inductance of the inductor L is about the parasitic inductance as in L=0.1 nH in FIG. 20A, the resonance frequency fr of the resonator P' overlaps with the pass band Pass. Thereby, the notch is formed in the pass band Pass. Therefore, the inductance of the inductor L is increased. Thereby, the attenuation poles A1 and A2 of the circuit 46 are formed at frequencies lower and higher than the pass band Pass, respectively, as illustrated by L=3.0 nH in FIG. 20A. Therefore, it is possible to suppress the formation of the notch caused by the circuit 46 in the pass band Pass. Actually, the inductance of the inductor L and the pitch Dp' of the resonator P' are adjusted so that the attenuation amount of the peak of the spurious response becomes large.

According to the third embodiment, the average pitch Dp' (second average pitch) of the electrode fingers 18 (second electrode finger) of the resonator P' is in the vicinity of the average pitch Dd (first average pitch) of the DMS filter 45 (multimode type filter). Thereby, the notch of the spurious response of the resonator P' compensates for the peak of the spurious response of the DMS filter 45. However, the attenuation pole due to the resonance frequency fr of the resonator P' is located within the pass band Pass. Therefore, the inductor L having an inductance larger than the inductance of the inductor L3 connected between the DMS filter 45 and the ground is provided. Thereby, even when the resonance frequency fr of the resonator P' alone is located within the pass band Pass, the attenuation poles A1 and A2 due to the resonance frequency of the resonator P' to which the inductor L is connected are not located within the pass band Pass.

The frequency of the spurious response of the resonator P' is changed by the inductor L. Therefore, the average pitch Dp' of the resonator P' is finely adjusted, so that the notch of the spurious response of the resonator P' compensates for the spurious response of the DMS filter 45. The average pitch Dp' of the resonator P' is preferably 1.03 times or less and 0.97 times or more than the average pitch Dd. The average pitch Dp' of the resonator P' is more preferably 1.02 times or less, and further preferably 1.015 times or less than the average pitch Dd. The average pitch Dp' of the resonator P' is more preferably 0.98 times or more, and further preferably 0.985 times or less than the average pitch Dd.

In order to locate the attenuation poles A1 and A2 due to the resonance frequency fr of the resonator P' outside the pass band, the inductance of the inductor L is more preferably 5 times or more, and still more preferably 10 times or more than the inductance of the inductor L3. The inductance of the inductor L is preferably 0.5 nH or more, and more preferably 1.0 nH or more. Thereby, even when the resonance frequency fr of the resonator P' alone is located within the pass band Pass, the attenuation poles A1 and A2 due to the resonance frequency of the resonator P' to which the inductor L is connected are not located within the pass band Pass.

When the inductance of the inductor L is too large, the notch of the spurious response becomes small. From this viewpoint, the inductance of the inductor L is preferably 100 times or less, more preferably 50 times or less, and still more preferably 20 times or less than the inductance of the inductor L3.

When the thickness T4 of the piezoelectric layer 14 is twice or less (that is, 1λ or less) the average pitch Dd of the DMS filter 45, the strong spurious response Sp is generated at some frequencies as illustrated in FIG. 3C. In this case, the spurious response can be more suppressed by providing the circuit 46.

First Modification of First and Second Embodiments

Figure 21A:
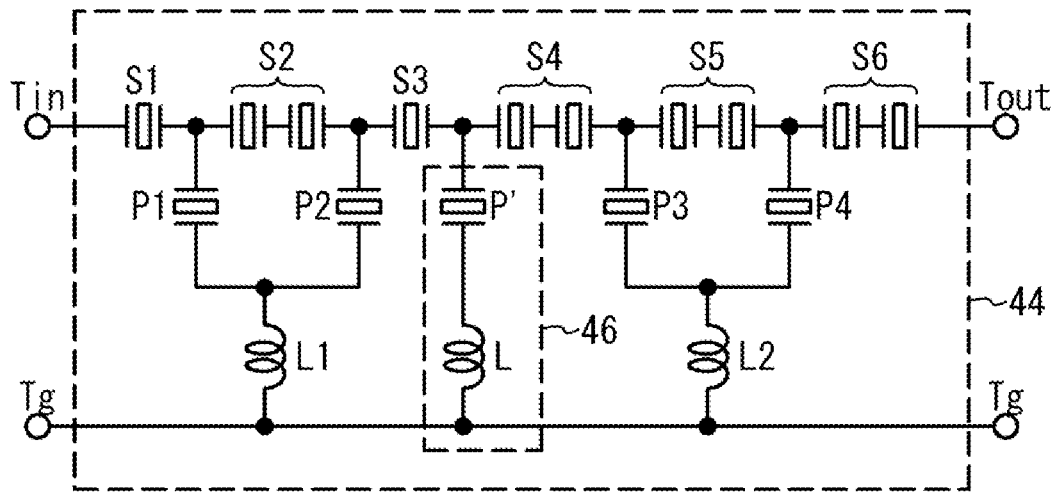
FIGS. 21A to 21C are circuit diagrams illustrating a filter according to first to third modifications of the first and the second embodiments.

FIG. 21A is a circuit diagram illustrating a filter according to a first modification of the first and the second embodiments. As illustrated in FIG. 21A, series resonators S1 to S6 and the parallel resonators P1 to P4 are provided. The circuit 46 is provided between the series resonators S3 and S4. The circuit 46 can be provided at any position on the path between the input terminal Tin and the output terminal Tout. Other configurations are the same as those of the first and the second embodiments, and the description thereof will be omitted.

Second Modification of First and Second Embodiments

Figure 21B:
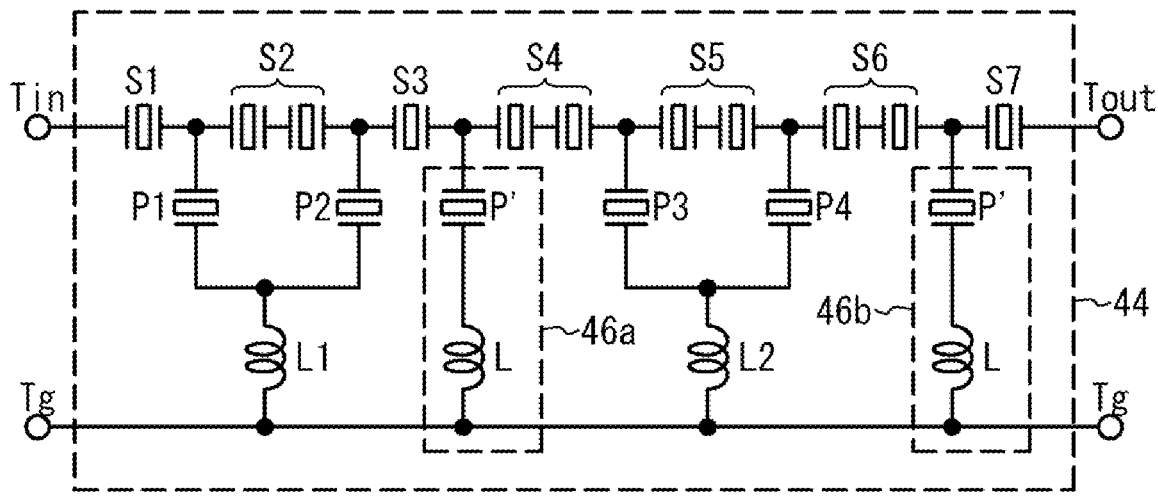

FIG. 21B is a circuit diagram illustrating a filter according to a second modification of the first and the second embodiments. As illustrated in FIG. 21B, series resonators S1 to S7 and the parallel resonators P1 to P4 are provided. A circuit 46a is provided between the series resonators S3 and S4, and a circuit 46b is provided between the series resonators S6 and S7. The circuits 46a and 46b can be provided at any positions on the path between the input terminal Tin and the output terminal Tout. For example, it is assumed that the circuit 46a is the circuit 46 of the first embodiment and the circuit 46b is the circuit 46 of the second embodiment. Thereby, both of the peak due to the spurious response of the series resonators S1 to S7 and the peak of the spurious response of the parallel resonators P1 to P4 can be compensated. Other configurations are the same as those of the first and the second embodiments, and the description thereof will be omitted.

Third Modification of First and Second Embodiments

Figure 21C:
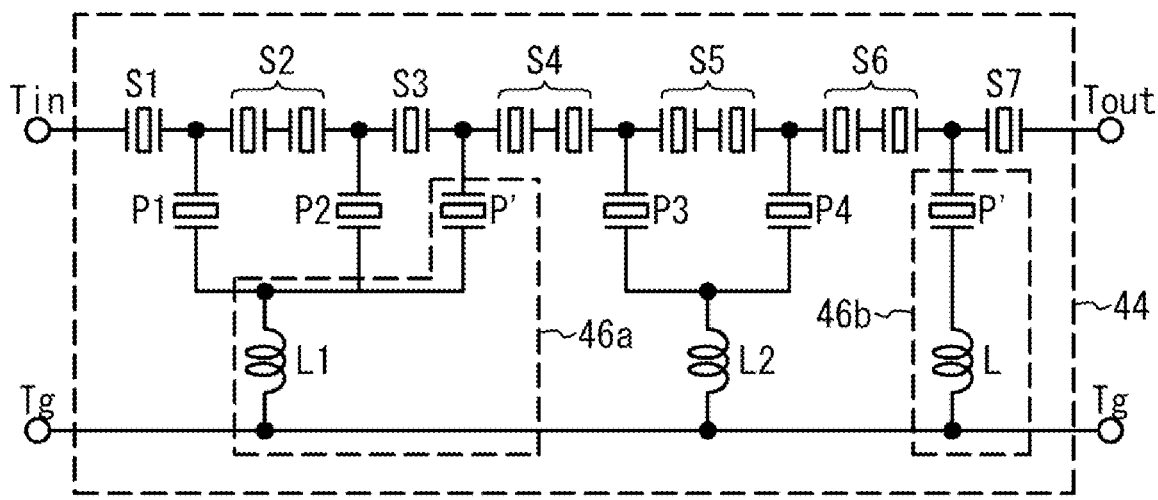

FIG. 21C is a circuit diagram illustrating a filter according to a third modification of the first and the second embodiments. As illustrated in FIG. 21C, the inductor of the circuit 46a is provided in common with the inductor L1 between the parallel resonators P1 and P2 and the ground. Other configurations are the same as those of the first and the second embodiments, and the description thereof will be omitted.

First Modification of First to Third Embodiments

Figure 22A:
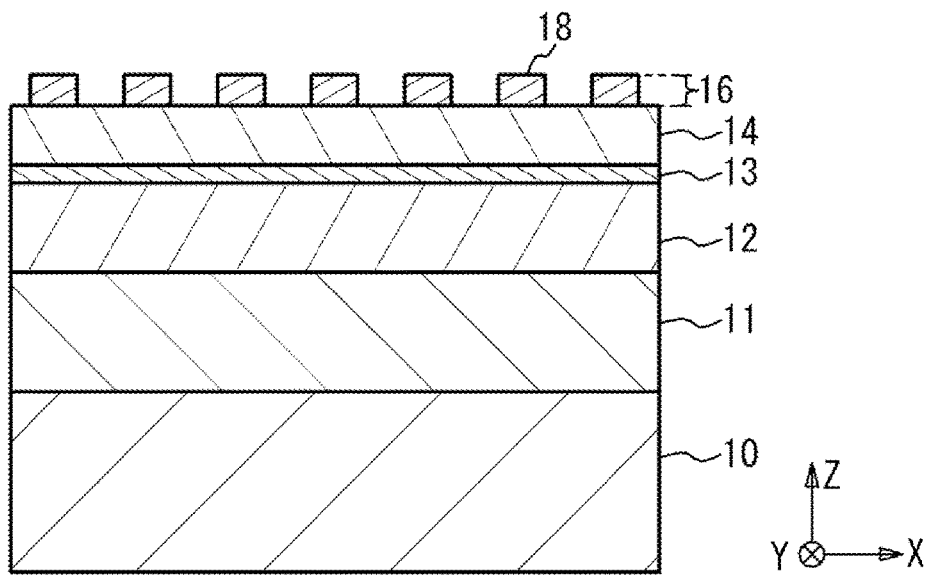
FIGS. 22A to 22C are cross-sectional views illustrating acoustic wave resonators according to the first to third modifications of the first to the third embodiments.

FIG. 22A is a cross-sectional view illustrating an acoustic wave resonator according to a first modification of the first to third embodiments. As illustrated in FIG. 22A, in the first modification of the first to the third embodiments, a bonding layer 13 is provided between the piezoelectric layer 14 and the temperature compensation film 12. The bonding layer 13 bonds the piezoelectric layer 14 to the temperature compensation film 12. When it is difficult to directly bond the piezoelectric layer 14 to the temperature compensation film 12, the bonding layer 13 may be provided. The bonding layer 13 is, for example, an aluminum oxide film, a silicon film, an aluminum nitride film, a silicon nitride film, or a silicon carbide film. The thickness of the bonding layer 13 is preferably 20 nm or less, and more preferably 10 nm or less, from the viewpoint of not impairing the functions of the piezoelectric layer 14 and the temperature compensation film 12. From the viewpoint of not impairing the function as the bonding layer 13, the thickness of the bonding layer 13 is preferably 1 nm or more, and more preferably 2 nm or more. From the viewpoint of confining the acoustic wave in the main mode in the piezoelectric layer 14, the acoustic velocity of the bulk wave propagating in the bonding layer 13 is preferably faster than the acoustic velocity of the bulk wave propagating in the temperature compensation film 12. Other configurations are the same as those of the first to the third embodiments, and the description thereof will be omitted.

Second Modification of First to Third Embodiments

Figure 22B:
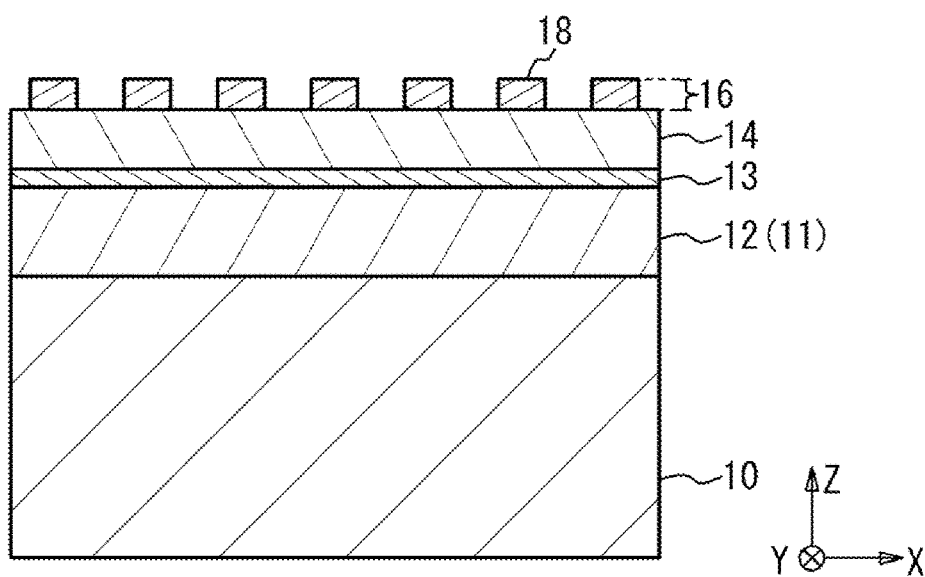

FIG. 22B is a cross-sectional view illustrating an acoustic wave resonator according to a second modification of the first to third embodiments. As illustrated in FIG. 22B, in the second modification of the first to third embodiments, the boundary layer is not provided between the temperature compensation film 12 and the support substrate 10. Other configurations are the same as those of the first modification of the first to the third embodiments, and the description thereof will be omitted. The boundary layer 11 may be provided instead of the temperature compensation film 12. That is, the temperature compensation film 12 may not be provided between the piezoelectric layer 14 and the boundary layer 11.

Third Modification of First to Third Embodiments

Figure 22C:
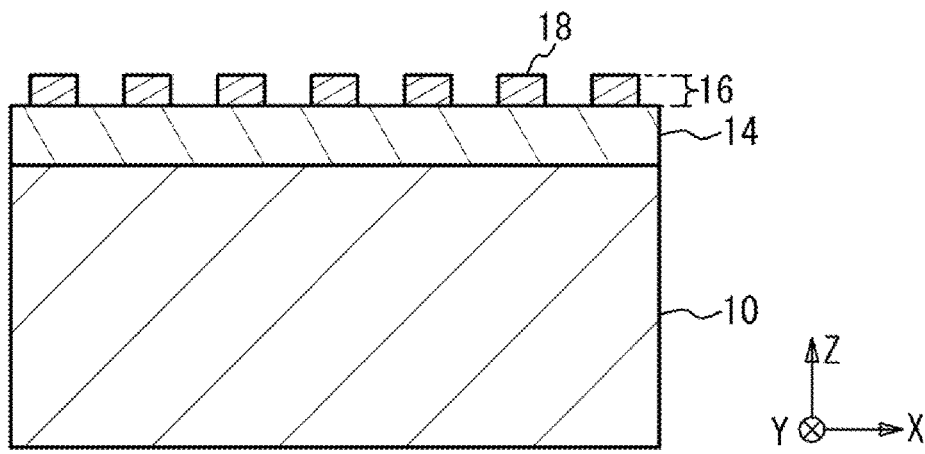

FIG. 22C is a cross-sectional view illustrating an acoustic wave resonator according to a third modification of the first to third embodiments. As illustrated in FIG. 22C, in the third modification of the first to third embodiments, the temperature compensation film 12 and the boundary layer 11 are not provided between the piezoelectric layer 14 and the support substrate 10, and the piezoelectric layer 14 and the support substrate 10 are directly bonded to each other by using, for example, a surface activation method. Other configurations are the same as those of the first to the third embodiments, and the description thereof will be omitted.

Fourth Modification of First to Third Embodiments

Figure 23A:
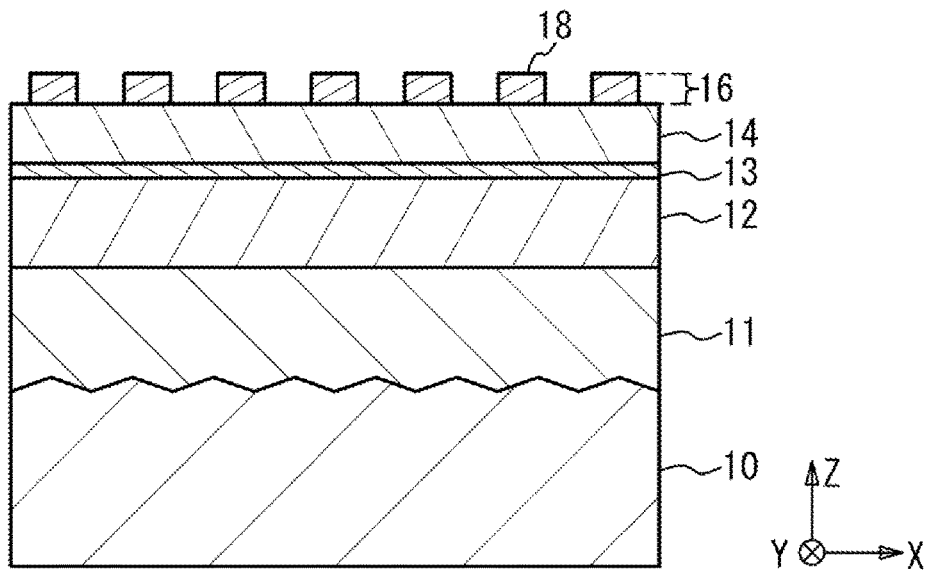
FIGS. 23A to 23C are cross-sectional views illustrating acoustic wave resonators according to fourth to sixth modifications of the first to the third embodiments.

FIG. 23A is a cross-sectional view illustrating an acoustic wave resonator according to a fourth modification of the first to the third embodiments. As illustrated in FIG. 23A, in the fourth modification of the first to the third embodiments, a periodic or irregular unevenness is provided at the interface between the support substrate 10 and the boundary layer 11. The unwanted waves are scattered by the unevenness, and the spurious can be suppressed. The interface between the boundary layer 11 and the temperature compensation film 12 is a substantially flat surface. Other configurations are the same as those of the first modification of the first to the third embodiments, and the description thereof will be omitted.

Fifth Modification of First to Third Embodiments

Figure 23B:
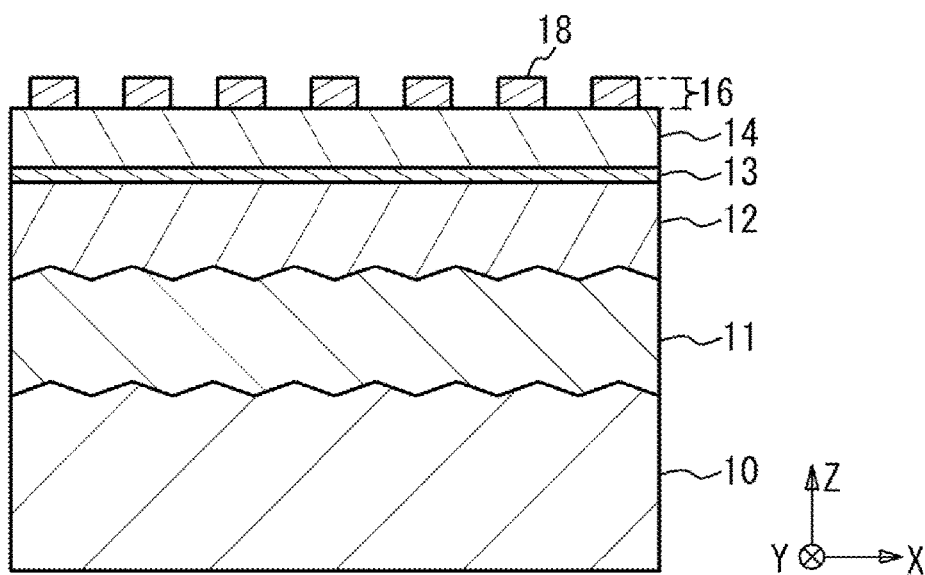

FIG. 23B is a cross-sectional view illustrating an acoustic wave resonator according to a fifth modification of the first to the third embodiments. As illustrated in FIG. 23B, in the fifth modification of the first to the third embodiments, periodic or irregular unevennesses are provided at an interface between the boundary layer 11 and the temperature compensation film 12 in addition to the interface between the support substrate 10 and the boundary layer 11. The unwanted waves are scattered by the unevennesses of the two layers, and the spurious can be suppressed. Other configurations are the same as those of the fourth modification of the first to the third embodiments, and the description thereof will be omitted.

Sixth Modification of First to Third Embodiments

Figure 23C:
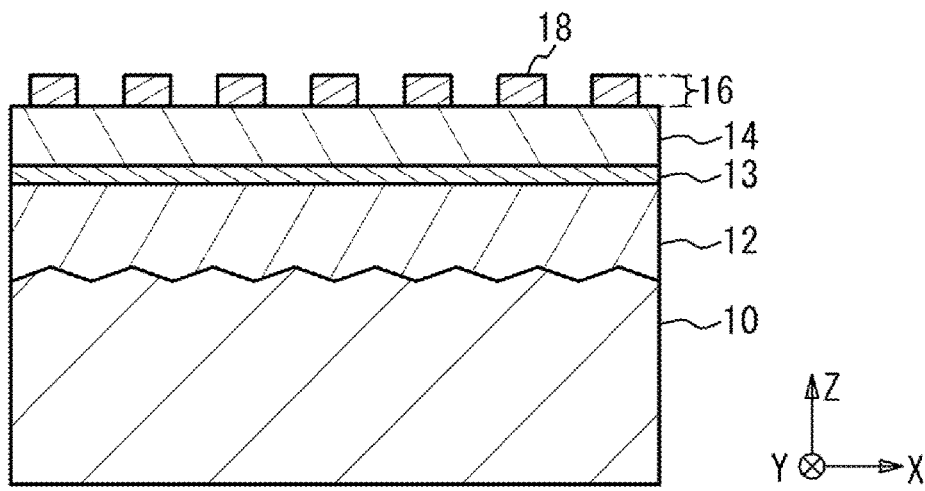

FIG. 23C is a cross-sectional view illustrating an acoustic wave resonator according to a sixth modification of the first to the third embodiments. As illustrated in FIG. 23C, in the sixth modification of the first to the third embodiments, a periodic or irregular unevenness is provided at an interface between the support substrate 10 and the temperature compensation film 12. Other configurations are the same as those of the second modification of the first to the third embodiments, and the description thereof will be omitted.

Also in the first to sixth modifications of the first to third embodiments, the high frequency spurious as illustrated in FIGS. 3B and 3C is generated by providing the piezoelectric layer 14 on the support substrate 10. Therefore, it is preferable to provide the circuit 46 as in the first to third embodiments. As in the first to third embodiments and the first, second and fourth to sixth modifications thereof, an insulating layer may be provided between the support substrate 10 and the piezoelectric layer 14. The insulating layer may be a single layer made of a uniform material, or may be a plurality of laminated layers.

(Simulation 6)

In the simulations 1 to 5, the interface between the support substrate 10 and the boundary layer 11 is the mirror surface. As illustrated in FIG. 23A of the fourth modification of the first to the third embodiments, it was examined whether the results of the simulations 1 to 5 could be applied when the interface between the support substrate 10 and the boundary layer 11 was the rough surface. The following resonator R4 was manufactured and the passage characteristics thereof were measured. Moreover, the passage characteristics of the resonator R5 were simulated.

Figure 24A:
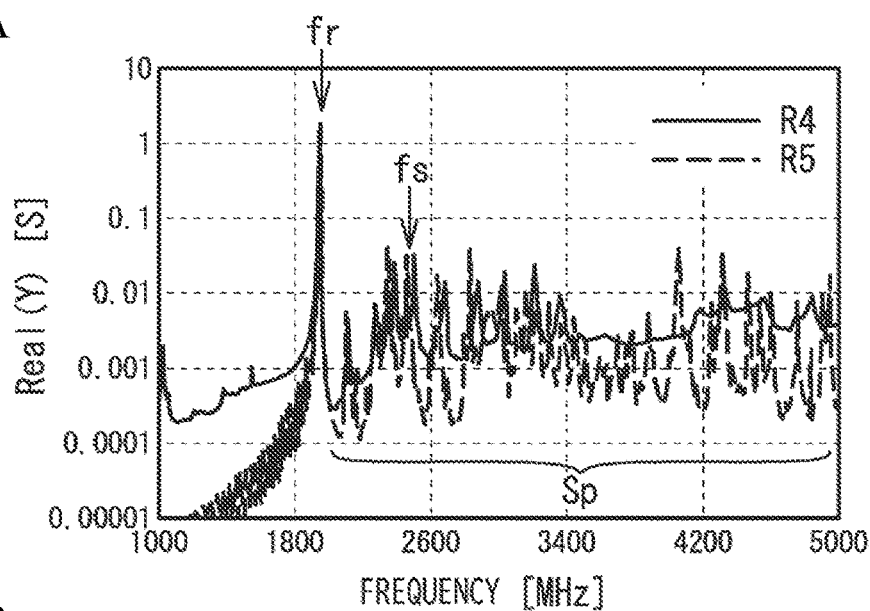
FIGS. 24A and 24B are diagrams illustrating Real (Y) and |Y| of the resonators R4 and R5 in a simulation 6, respectively.
Figure 24B:
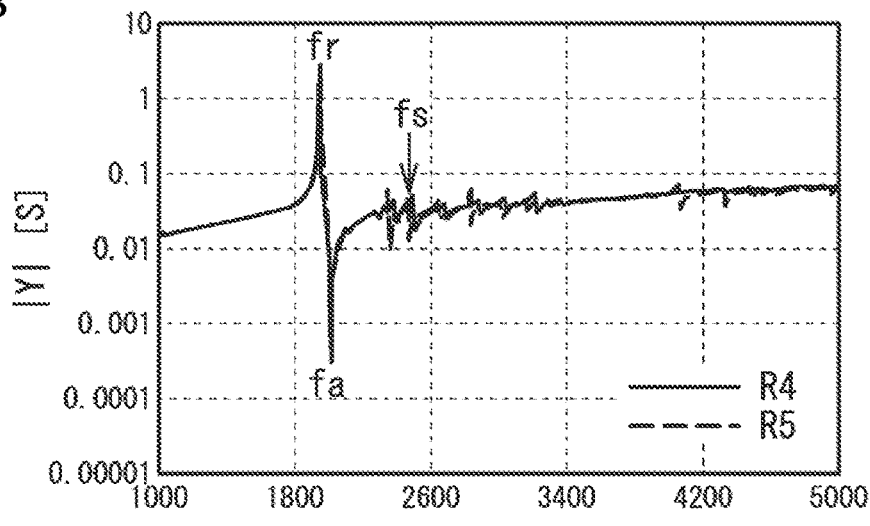
Figure 24C:
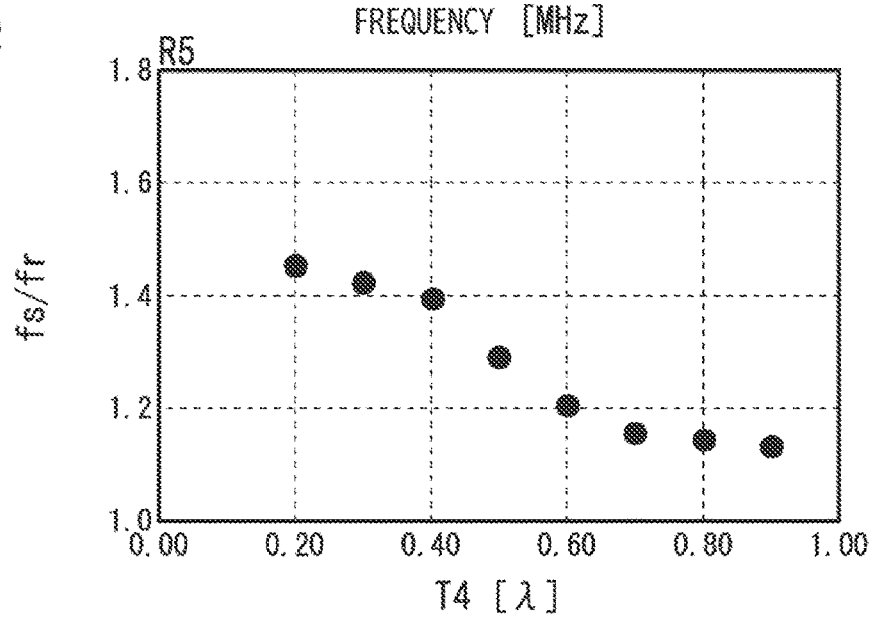
FIG. 24C is a diagram illustrating fs/fr with respect to a thickness T4 of a piezoelectric layer 14 in the resonator R5.

Resonator R4
  Support substrate 10: Sapphire substrate having a thickness of 500 μm
  Boundary layer 11: Aluminum oxide layer having a thickness of 5.0 μm
  Temperature compensation film 12: None
  Piezoelectric layer 14: 42° Y-cut X-propagation lithium tantalate layer having a thickness of 1.2 μm
  Metal film 16: Titanium film having a thickness of 40 nm and Aluminum film having a thickness of 130 nm arranged in this order from the piezoelectric layer 14
  Protective film on the metal film 16: Silicon oxide film having a thickness of 15 nm
  Interface between the support substrate 10 and the boundary layer 11: Rough surface having an arithmetic mean roughness Ra of 0.15 μm
  2×pitch D of electrode finger 18: 2.0 μm Resonator R5
  Support substrate 10: Sapphire substrate having a thickness of 30 μm
  Boundary layer 11: Aluminum oxide layer having a thickness of 5.0 μm
  Temperature compensation film 12: None
  Piezoelectric layer 14: 42° Y-cut X-propagation lithium tantalate layer having a thickness of 1.2 μm
  Metal film 16: Titanium film having a thickness of 40 nm and Aluminum film having a thickness of 130 nm arranged in this order from the piezoelectric layer 14
  Protective film on the metal film 16: None
  Interface between the support substrate 10 and the boundary layer 11: Mirror surface FIGS. 24A and 24B are diagrams illustrating Real (Y) and |Y| of the resonators R4 and R5 in a simulation 6, respectively. FIG. 24C is a diagram illustrating fs/fr with respect to the thickness T4 of the piezoelectric layer 14 in the resonator R5. The Real (Y) and the |Y| are a real part of admittance and an absolute value of the admittance, respectively.

As illustrated in FIGS. 24A and 24B, in the resonators R4 and R5, the resonance frequencies fr in the main mode, the antiresonance frequencies fa, and the maximum frequencies fs of the peak of the spurious response are substantially the same as each other. It is considered that a reason why the spurious response Sp of the resonator R5 is larger than that of the resonator R4 is that the interface between the support substrate 10 and the boundary layer 11 is the mirror surface. The peak frequencies of the spurious response Sp are substantially the same as each other in the resonators R4 and R5. As described above, it can be seen that the results of the simulations 1 to 5 can be applied even when the interface between the support substrate 10 and the boundary layer 11 is the rough surface.

As illustrated in FIG. 24C, when the thickness T4 of the piezoelectric layer 14 is 0.7λ to 0.9λ (λ=2×D), fs/fr is about 1.15. When the thickness T4 is 0.7λ or less, fs/fr becomes large. When the thickness T4 is 0.2λ, fs/fr is about 1.45. When fs/fr is 1.1 or more, the spurious response becomes problematic, and when fs/fr is 1.2 times or more, the spurious response becomes more problematic. Therefore, when the thickness T4 of the piezoelectric layer 14 is 1λ (2×D) or less, the spurious response becomes problematic. When the thickness T4 of the piezoelectric layer 14 is 0.7λ (1.4×D) or less, the spurious response becomes more problematic. When the thickness T4 of the piezoelectric layer 14 is 0.6λ (1.2×D) or less, the spurious response becomes even more problematic.

Fourth Embodiment

Figure 25:
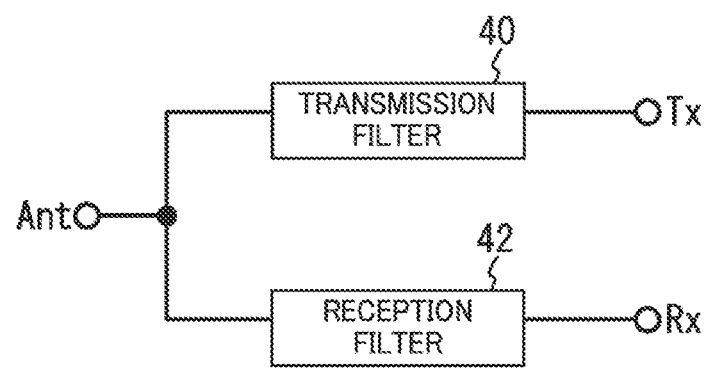
FIG. 25 is a circuit diagram illustrating a duplexer according to a fourth embodiment.

FIG. 25 is a circuit diagram illustrating a duplexer according to a fourth embodiment. As illustrated in FIG. 25, a transmission filter 40 is connected between a common terminal Ant and a transmission terminal Tx. A reception filter 42 is connected between the common terminal Ant and a reception terminal Rx. The transmission filter 40 passes a signal in a transmission band among the high frequency signals input from the transmission terminal Tx, to the common terminal Ant as a transmission signal, and suppresses signals having other frequencies. The reception filter 42 passes a signal in a reception band among the high frequency signals input from the common terminal Ant, to the reception terminal Rx as a reception signal, and suppresses signals having other frequencies. At least one of the transmission filter 40 and the reception filter 42 can be used as the filter of the first embodiment and its modifications.

Although the duplexer is described as an example as the multiplexer, a triplexer or a quadplexer may be used as the multiplexer.

Although the embodiments of the present invention have been described in detail, it is to be understood that the various change, substitutions, and alterations could be made hereto without departing from the spirit and scope of the invention.

What is claimed is:

1. A filter comprising:
   a support substrate;
   a piezoelectric layer provided on the support substrate;
   one or more series resonators connected in series between an input terminal and an output terminal, wherein each of the one or more series resonators has a plurality of first electrode fingers provided on the piezoelectric layer and having a first average pitch;
   one or more parallel resonators having one end connected to a path between the input terminal and the output terminal and another end connected to a ground, wherein each of the one or more parallel resonators has a plurality of second electrode fingers provided on the piezoelectric layer and having a second average pitch more than a maximum first average pitch;
   another resonator having one end connected to the path, wherein the another resonator has a plurality of third electrode fingers provided on the piezoelectric layer and having a third average pitch less than or equal to an intermediate value that is half a sum of the maximum first average pitch and a minimum second average pitch; and
   an inductor having one end connected to another end of the another resonator and another end connected to the ground, and having an inductance more than a maximum inductance connected between the one or more parallel resonators and the ground,
   wherein when the maximum first average pitch is Dsmax and a minimum first average pitch which is different from the maximum first average pitch is Dsmin, (Dsmax−Dsmin)/(Dsmax+Dsmin) is 0.005 or less.

2. The filter as claimed in claim 1, wherein
   the third average pitch is 1.02 times or less than the maximum first average pitch and 0.98 times or more a minimum first average pitch.

3. The filter as claimed in claim 1, wherein
   the inductance of the inductor is 5 times or more a maximum inductance connected between the one or more parallel resonators and the ground.

4. The filter as claimed in claim 1, wherein
   a thickness of the piezoelectric layer is twice or less a maximum second average pitch.

5. The filter as claimed in claim 1, wherein
   the inductance of the inductor is 0.5 nH or more.

6. The filter as claimed in claim 1, wherein
   a resonance frequency of the another resonator alone is located within the pass band of the filter, and an attenuation pole due to the resonance frequency of the another resonator to which the inductor is connected is not located within the pass band.

7. The filter as claimed in claim 1, further comprising:
   an insulating layer provided between the support substrate and the piezoelectric layer.

8. A multiplexer comprising the filter as claimed in claim 1.

9. A filter comprising:
   a support substrate;
   a piezoelectric layer provided on the support substrate;
   one or more series resonators connected in series between an input terminal and an output terminal, wherein each of the one or more series resonators has a plurality of first electrode fingers provided on the piezoelectric layer and having a first average pitch;
   one or more parallel resonators having one end connected to a path between the input terminal and the output terminal and another end connected to a ground, wherein each of the one or more parallel resonators has a plurality of second electrode fingers provided on the piezoelectric layer and having a second average pitch more than a maximum first average pitch;
   another resonator having one end connected to the path, wherein the another resonator has a plurality of third electrode fingers provided on the piezoelectric layer and having a third average pitch smaller than a minimum second average pitch and more than or equal to an intermediate value that is half a sum of the maximum first average pitch and the minimum second average pitch; and
   an inductor having one end connected to another end of the another resonator and another end connected to the ground, and having an inductance more than a maximum inductance connected between the one or more parallel resonators and the ground,
   wherein a difference between the minimum second average pitch and the third average pitch is 3 times or more than a difference between a maximum second average pitch which is different from the minimum second average pitch and the minimum second average pitch.

10. The filter as claimed in claim 9, wherein
    the third average pitch is 0.98 times or more the minimum second average pitch.

11. A multiplexer comprising the filter as claimed in claim 9.

* * * * *